US012804964B2

(12) United States Patent
Yang et al.

(10) Patent No.: US 12,804,964 B2
(45) Date of Patent: Nov. 17, 2026

(54) INSULATED GATE BIPOLAR TRANSISTOR AND MANUFACTURING METHOD THEREOF, AND ELECTRONIC DEVICE

(71) Applicant: Huawei Digital Power Technologies Co., Ltd., Shenzhen (CN)

(72) Inventors: Wentao Yang, Dongguan (CN); Miao Hu, Shenzhen (CN); Chaofan Song, Shanghai (CN); Qian Zhao, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 367 days.

(21) Appl. No.: 18/651,513

(22) Filed: Apr. 30, 2024

(65) Prior Publication Data

US 2024/0282811 A1 Aug. 22, 2024

Related U.S. Application Data

(63) Continuation of application No. PCT/CN2022/100066, filed on Jun. 21, 2022.

(30) Foreign Application Priority Data

Oct. 30, 2021 (CN) ......................... 202111278434.4

(51) Int. Cl.
*H10D 12/01* (2025.01)
*H10D 12/00* (2025.01)
(Continued)

(52) U.S. Cl.
CPC ......... *H10D 62/107* (2025.01); *H10D 12/038* (2025.01); *H10D 12/481* (2025.01); *H10D 64/111* (2025.01)

(58) Field of Classification Search
CPC .. H10D 62/107; H10D 12/038; H10D 12/481; H10D 64/111; H10D 62/106;
(Continued)

(56) References Cited

U.S. PATENT DOCUMENTS 6,524,894 B1 * 2/2003 Nozaki ................ H10D 12/441 438/137

FOREIGN PATENT DOCUMENTS

CN 202282353 U 6/2012
CN 104143568 A 11/2014
(Continued)

OTHER PUBLICATIONS

E.Suekawa, Y. Tomomatsu et al. High Voltage IGBT(HV-IGBT) having p'/p' collector region, Proceedings of 1998 International Symposium on Power Semiconductor Devices and ICs, Kyoto, Nov. 12, 1998, total 4 pages.

*Primary Examiner* — Elias Ullah

(57) ABSTRACT

An IGBT has a front-surface device region, an IGBT drift region, an IGBT buffer region, and an IGBT collector region that are sequentially connected. The front-surface device region may include a cell region, a field plate region, and a field limiting ring region. The IGBT drift region has a first-type doping element, the IGBT buffer region has a first-type doping element, and a concentration of the first-type doping element in the IGBT buffer region is greater than a concentration of the first-type doping element in the IGBT drift region. The IGBT collector region includes a cell collector region, a field plate collector region, and a field limiting ring collector region. The IGBT collector region has a second-type doping element, and a concentration of a second-type doping element in the cell collector region is greater than a concentration of a second-type doping element in the field plate collector region.

17 Claims, 13 Drawing Sheets

(51) Int. Cl.
*H10D 62/10* (2025.01)
*H10D 64/00* (2025.01)

(58) Field of Classification Search
CPC .. H10D 62/142; H10D 64/112; H10D 62/103; H10D 12/032; H10D 12/411
See application file for complete search history.

(56) References Cited

FOREIGN PATENT DOCUMENTS

| | | | |
|---|---|---|---|
| CN | 109256422 | A | 1/2019 |
| CN | 109671771 | A | 4/2019 |
| CN | 113097287 | A | 7/2021 |
| CN | 114188396 | A | 3/2022 |

* cited by examiner

4B

4A

INSULATED GATE BIPOLAR TRANSISTOR AND MANUFACTURING METHOD THEREOF, AND ELECTRONIC DEVICE

CROSS-REFERENCE TO RELATED APPLICATIONS

This application is a continuation of International Application No. PCT/CN2022/100066, filed on Jun. 21, 2022, which claims priority to Chinese Patent Application No. 202111278434.4, filed on Oct. 30, 2021. The disclosures of the aforementioned applications are hereby incorporated by reference in their entireties.

TECHNICAL FIELD

This application relates to the field of integrated circuit manufacturing, and in particular, to an insulated gate bipolar transistor and manufacturing method thereof, and an electronic device.

BACKGROUND

An insulated gate bipolar transistor (IGBT) is a composite full-controlled voltage driven function semiconductor device that includes a bipolar junction transistor (BJT) and an insulated gate field-effect transistor (MOSFET).

The BJT has a low saturation voltage drop and a high current carrying density, but has a large drive current. The MOSFET has very low drive power and a fast switching speed, but has a high conduction voltage drop and a low current carrying density. The IGBT combines advantages of the MOSFET and the BJT, and has advantages such as a high input impedance, a fast switching speed, good thermal stability, a simple drive circuit, a small drive current, a low saturation voltage drop, a high withstand voltage, and a large withstand current. Therefore, the IGBT is well applicable to a converter system with a direct current voltage of 600 V or above, fields such as alternating current motors, frequency converters, switch-mode power supplies, lighting circuits, and traction and transmission.

However, the existing IGBT has a problem that a withstand voltage characteristic is poor, and the withstand voltage characteristic includes a maximum reverse withstand voltage level that can be withstood by the IGBT, which may be reflected by using a $BV_{CES}$ (collector-emitter blocking voltage). The $BV_{CES}$ is a maximum reverse withstand voltage that can be withstood between a collector and an emitter under the action of a specified current between the collector and the emitter when a short circuit occurs between a gate and the emitter. A larger maximum reverse withstand voltage indicates a better withstand voltage characteristic of the device.

SUMMARY

In view of this, embodiments of this application provide an insulated gate bipolar transistor and manufacturing method thereof, and an electronic device, to improve a withstand voltage characteristic of the device.

According to a first aspect, an embodiment of this application provides an insulated gate bipolar transistor IGBT, including a first surface and a second surface that are opposite to each other, and in a direction from the first surface to the second surface, a front-surface device region, an IGBT drift region, an IGBT buffer region, and an IGBT collector region are sequentially connected. The front-surface device region may include a cell region and a terminal region surrounding the cell region, and the terminal region includes a field plate region surrounding the cell region and a field limiting ring region surrounding the field plate region. The IGBT drift region has a first-type doping element, the IGBT buffer region has a first-type doping element, and a concentration of the first-type doping element in the IGBT buffer region is greater than a concentration of the first-type doping element in the IGBT drift region. The IGBT collector region includes a cell collector region, a field plate collector region, and a field limiting ring collector region. The cell collector region coincides with a projection of the cell region on the first surface, the field plate collector region coincides with a projection of the field plate region on the first surface, and the field limiting ring collector region coincides with a projection of the field limiting ring region on the first surface. The IGBT collector region has a second-type doping element, and when a concentration of a second-type doping element in the cell collector region is equal to a concentration of a second-type doping element in the field plate collector region, the field plate region is more prone to breakdown than the cell region. In this way, the concentration of the second-type doping element in the cell collector region can be designed to be greater than the concentration of the second-type doping element in the field plate collector region. In other words, a part of the collector region opposite to the cell region has a second-type doping element with a larger concentration, and a part of the collector region opposite to the field plate region has a second-type doping element with a smaller concentration. This effectively reduces an amplification factor of a parasitic triode in the field plate region, reduces a leakage current value of the device when the device withstands a reverse withstand voltage, improves a withstand voltage characteristic and a safe operation area characteristic of the device, enhances robustness of the device, and improves overall operating performance of the device.

In some implementations, the cell collector region is a heavily doped region, and the field plate collector region is a lightly doped region.

In this embodiment of this application, the cell collector region may be the heavily doped region, the field plate collector region may be the lightly doped region, and the concentration of the second-type doping element in the field plate collector region is effectively reduced. Therefore, an amplification factor of a triode in the field plate region can be effectively reduced, and a withstand voltage characteristic of the device is improved.

In some implementations, the concentration of the second-type doping element in the cell collector region is greater than a concentration of a second-type doping element in the field limiting ring collector region.

In this embodiment of this application, on the basis of being greater than the concentration of the second-type doping element in the field plate collector region, the concentration of the second-type doping element in the cell collector region may further be greater than the concentration of the second-type doping element in the field limiting ring collector region. In this way, an amplification factor of a triode in the terminal region is effectively reduced, and a withstand voltage characteristic of the device is improved.

In some implementations, the cell collector region is the heavily doped region, and the field limiting ring collector region is a lightly doped region.

In this embodiment of this application, the field limiting ring collector region may be made to be the lightly doped region, so that the concentration of the second-type doping element in the field limiting ring collector region is effectively reduced. Therefore, an amplification factor of a triode in the field limiting ring region can be effectively reduced, and a withstand voltage characteristic of the device is improved.

In some implementations, the IGBT is a planar gate IGBT.

The cell region includes a matrix region, a gate region, and a gate oxidized region. The matrix region includes a base region, a first emitting region, and a second emitting region. The first emitting region and the second emitting region are located on a side that is of the matrix region and that is away from the second surface. The first emitting region has a first-type doping element, the second emitting region has a second-type doping element, and the base region has a second-type doping element. The first emitting region is configured to connect to an emitter. A concentration of the second-type doping element in the second emitting region is greater than a concentration of the second-type doping element in the base region. The gate region is configured to connect to a gate electrode, and the gate region and the gate oxidized region are located on a side that is outside the matrix region and that is away from the second surface. The IGBT collector region is configured to connect to a collector.

In this embodiment of this application, the IGBT may be the planar gate IGBT, and the gate region and the gate oxidized region are disposed outside the base region, thereby facilitating implementation of device diversity.

In some implementations, the IGBT is a trench gate IGBT.

The cell region includes a matrix region, and the matrix region includes a base region, a gate region, a gate oxidized region, a first emitting region, and a second emitting region. The gate region, the gate oxidized region, the first emitting region, and the second emitting region are located on a side that is of the matrix region and that is away from the second surface. The first emitting region has a first-type doping element, the second emitting region has a second-type doping element, and the base region has a second-type doping element. The first emitting region is configured to connect to an emitter. A concentration of the second-type doping element in the second emitting region is greater than a concentration of the second-type doping element in the base region. The gate region is configured to connect to a gate electrode, and the gate oxidized region surrounds the gate region in the matrix region. The IGBT collector region is configured to connect to a collector.

In this embodiment of this application, the IGBT may be the trench gate IGBT, and the gate region and the gate oxidized region are disposed inside the matrix region, thereby facilitating implementation of device diversity.

In some implementations, the field plate region includes a first field ring region, a gate bus, and a field plate dielectric layer located between the first field ring region and the gate bus, the first field ring region has a second-type doping element for connecting to the emitter, and the gate bus is configured to connect to the gate electrode.

The field limiting ring region includes a second field ring region, a control structure, and a field limiting ring dielectric layer located between the second field ring region and the control structure, and the second field ring region has a second-type doping element.

In this embodiment of this application, the field plate region may include the first field ring region, the gate bus, and the field plate dielectric layer, and the field limiting ring region may include the second field ring region, the control structure, and the field limiting ring dielectric layer, to effectively implement a planar electric field voltage division function for the IGBT.

In some implementations, the first type is the N type, and the second type is the P type.

In this embodiment of this application, the first type may be the N type, and the second type may be the P type, so that the device has lower drive energy consumption.

According to a second aspect, an embodiment of this application provides an insulated gate bipolar transistor IGBT manufacturing method, and the method includes the following steps:

forming a front-surface device region on a first surface of a substrate, where the substrate has a first-type doping element, the front-surface device region includes a cell region and a terminal region surrounding the cell region, and the terminal region includes a field plate region surrounding the cell region and a field limiting ring region surrounding the field plate region;

performing doping of the first-type doping element on a part that is of the substrate and that faces a second surface, to obtain an IGBT buffer region, where a concentration of a first-type doping element in the IGBT buffer region is greater than a concentration of the first-type doping element in the substrate, the substrate between the front-surface device region and the IGBT buffer region is used as an IGBT drift region, and the first surface and the second surface are opposite surfaces;

performing first doping of a second-type doping element on a part that is of the IGBT drift region and that faces the second surface, to obtain an IGBT collector region, where the IGBT collector region includes a cell collector region, a field plate collector region, and a field limiting ring collector region, the cell collector region coincides with a projection of the cell region on the first surface, the field plate collector region coincides with a projection of the field plate region on the first surface, the field limiting ring collector region coincides with a projection of the field limiting ring region on the first surface, the first type is a P type or an N type, the second type is a P type or an N type, and the first type and the second type are different; and shielding the field plate collector region, and performing second doping of the second-type doping element on the IGBT collector region, so that a concentration of a second-type doping element in the cell collector region is greater than a concentration of a second-type doping element in the field plate collector region.

In some implementations, the shielding the field plate collector region, and performing second doping of the second-type doping element on the IGBT collector region, so that a concentration of a second-type doping element in the cell collector region is greater than a concentration of a second-type doping element in the field plate collector region includes the following step:

shielding the field plate collector region and the field limiting ring collector region, and performing the second doping of the second-type doping element on the IGBT collector region, so that the concentration of the second-type doping element in the cell collector region is greater than the concentration of the second-type doping element in the field plate collector region and is greater than a concentration of a second-type doping element in the field limiting ring collector region.

In some implementations, the first doping is light doping, and the second doping is heavy doping.

In some implementations, if the IGBT is a planar gate IGBT, the cell region includes a matrix region, a gate region, and a gate oxidized region, the matrix region includes a base region, a first emitting region, and a second emitting region, the first emitting region and the second emitting region are located on a side that is of the matrix region and that is away from the second surface, the first emitting region is configured to connect to an emitter, the gate region is configured to connect to a gate electrode, the IGBT collector region is configured to connect to a collector, and the gate region and the gate oxidized region are located on a side that is outside the substrate and that is away from the second surface; and forming the matrix region on the first surface of the substrate includes the following steps: performing doping of a second-type doping element on a part that is of the substrate and that is away from the second surface to obtain the base region, performing doping of a first-type doping element on a first part that is of the base region and that is away from the second surface to obtain the first emitting region, and performing doping of a second-type doping element on a second part that is of the base region and that is away from the second surface to obtain the second emitting region.

In some implementations, if the IGBT is a trench gate IGBT, the cell region includes a matrix region, the matrix region includes a base region, a gate region, a gate oxidized region, a first emitting region, and a second emitting region, the gate region, the gate oxidized region, the first emitting region, and the second emitting region are located on a side that is of the matrix region and that is away from the second surface, the first emitting region is configured to connect to an emitter, the gate region is configured to connect to a gate electrode, the IGBT collector region is configured to connect to a collector, and the gate region and the gate oxidized region are located on a side that is of the substrate and that is away from the second surface; and forming the matrix region on the first surface of the substrate includes the following steps: performing doping of a second-type doping element on a part that is of the substrate and that is away from the second surface to obtain the base region, performing doping of a first-type doping element on a first part that is of the base region and that is away from the second surface to obtain the first emitting region, and performing doping of a second-type doping element on a second part that is of the base region and that is away from the second surface to obtain the second emitting region.

In some implementations, the field plate region includes a first field ring region, a gate bus, and a field plate dielectric layer located between the first field ring region and the gate bus, the first field ring region has a second-type doping element for connecting to the emitter, and the gate bus is configured to connect to the gate electrode.

The field limiting ring region includes a second field ring region, a control region, and a field limiting ring dielectric layer located between the second field ring region and the control region, and the second field ring region has a second-type doping element.

In some implementations, the first type is the N type, and the second type is the P type.

According to a third aspect, an embodiment of this application provides an electronic device, including a circuit board and the IGBT connected to the circuit board according to the first aspect.

In some implementations, the electronic device is a power converter.

BRIEF DESCRIPTION OF DRAWINGS

To clearly understand implementations of this application, the following briefly describes accompanying drawings used in describing the implementations of this application. Apparently, the accompanying drawings show merely some embodiments of this application.

DESCRIPTION OF EMBODIMENTS

Figure 1:
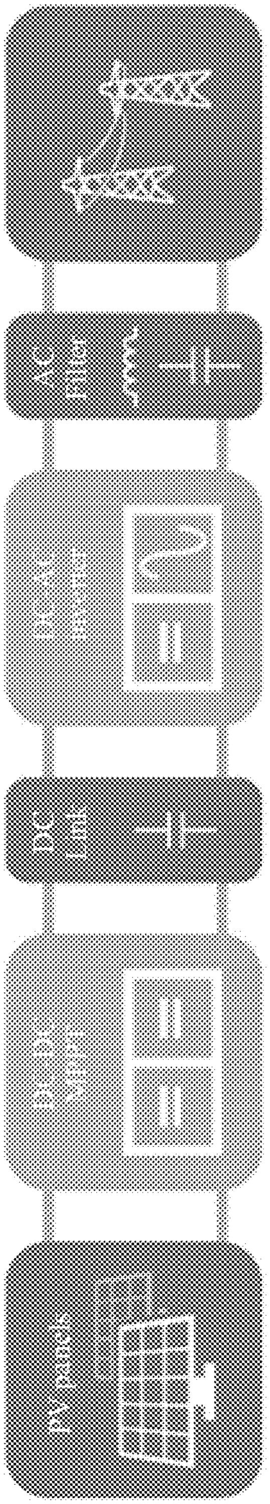
FIG. 1 is a diagram of an architecture of a smart grid according to an embodiment of this application.

Embodiments of this application provide an insulated gate bipolar transistor and manufacturing method thereof, and an electronic device, to improve a withstand voltage characteristic of the device.

In the specification, claims, and accompanying drawings of this application, terms "first", "second", "third", "fourth", and so on (if existent) are intended to distinguish between similar objects but do not necessarily indicate a specific order or sequence. It should be understood that the terms used in such a way are interchangeable in a proper circumstance, so that embodiments described herein can be implemented in another order other than the order illustrated or described herein. In addition, terms "include", "have" and any other variants are intended to cover the non-exclusive inclusion. For example, a process, method, system, product, or device that includes a list of steps or units is not necessarily limited to those expressly listed steps or units, but may include other steps or units not expressly listed or inherent to such a process, method, product, or device.

This application is described in detail with reference to diagrams. When embodiments of this application are described in detail, for ease of description, a cross-sectional diagram indicating a component structure is partially enlarged not based on a general scale. In addition, the diagrams are merely examples, and shall not limit the protection scope of this application herein. In addition, three-dimensional space dimensions of length, width, and depth should be included in the actual production.

Currently, an IGBT has a problem that a withstand voltage characteristic is poor, and the withstand voltage characteristic includes a maximum reverse withstand voltage level that can be withstood by the IGBT, which may be reflected by a $BV_{CES}$. The $BV_{CES}$ is a maximum reverse withstand voltage that can be withstood between a collector and an emitter under the action of a specified current between the collector and the emitter when a short circuit occurs between a gate and the emitter. A larger maximum reverse withstand voltage indicates a better withstand voltage characteristic of the device.

As the current between the collector and the emitter increases, the maximum reverse withstand voltage also increases. However, when the maximum reverse withstand voltage exceeds an avalanche resistance of the device, a snap back phenomenon occurs in the $BV_{CES}$. In this case, as the current increases, if the maximum reverse withstand voltage decreases, that is, BV negative resistance effect is displayed, a large leakage current occurs in a terminal region of the device. As the current further increases, an amplification factor of the device increases. Under the negative feedback, the device is damaged and finally burnt.

Based on the foregoing technical problem, embodiments of this application provide an insulated gate bipolar transistor (IGBT) and manufacturing method thereof, and an electronic device. The IGBT includes a first surface and a second surface that are opposite to each other, and in a direction from the first surface to the second surface, a front-surface device region, an IGBT drift region, an IGBT buffer region, and an IGBT collector region are sequentially connected. The front-surface device region may include a cell region and a terminal region surrounding the cell region, and the terminal region includes a field plate region surrounding the cell region and a field limiting ring region surrounding the field plate region. The IGBT drift region has a first-type doping element, the IGBT buffer region has a first-type doping element, and a concentration of the first-type doping element in the IGBT buffer region is greater than a concentration of the first-type doping element in the IGBT drift region. The IGBT collector region includes a cell collector region, a field plate collector region, and a field limiting ring collector region. The cell collector region coincides with a projection of the cell region on the first surface, the field plate collector region coincides with a projection of the field plate region on the first surface, and the field limiting ring collector region coincides with a projection of the field limiting ring region on the first surface. The IGBT collector region has a second-type doping element, and when a concentration of a second-type doping element in the cell collector region is equal to a concentration of a second-type doping element in the field plate collector region, the field plate region is more prone to breakdown than the cell region. In this way, the concentration of the second-type doping element in the cell collector region can be designed to be greater than the concentration of the second-type doping element in the field plate collector region. In other words, a part of the collector region opposite to the cell region has a second-type doping element with a larger concentration, and a part of the collector region opposite to the field plate region has a second-type doping element with a smaller concentration. This effectively reduces an amplification factor of a parasitic triode in the field plate region, reduces a leakage current value of the device when the device withstands a reverse withstand voltage, improves a withstand voltage characteristic and a safe operation area characteristic of the device, enhances robustness of the device, and improves overall operating performance of the device.

To make the objectives, features, and advantages of this application more apparent and easier to understand, the following describes implementations of this application in detail with reference to the accompanying drawings.

The IGBT is used for power conversion and can be applied to a power converter. The IGBT is applicable to a converter system with a direct current voltage of 600 V or above, fields such as frequency converters, alternating current motors, switch-mode power supplies, lighting circuits, and traction and transmission, and is further applicable to fields such as new energy vehicles, smart grids, and rail transport.

An IGBT module plays a crucial role in an electric vehicle, and is a core technical component of a charging pile of the electric vehicle. The IGBT module accounts for nearly 10% of costs of the electric vehicle and about 20% of costs of the charging pile. The IGBT can be applied to an electrical control system of the electric vehicle, and drive a motor of the vehicle through high-power direct current/alternating current (DC/AC) inversion. The IGBT can also be applied to a vehicle-mounted air conditioner control system of the electric vehicle and undergoes low-power direct current/alternating current (DC/AC) inversion, and an IGBT with a small current can be used herein. The IGBT can also be applied to the charging pile in which the IGBT module is used as a switching element.

The IGBT is widely applied to a power generation end, a power transmission end, a power transformation end, and a power consumption end of the smart grid. From a perspective of the power generation end, the IGBT module is required for rectifiers and inverters during wind power generation and photovoltaic power generation. From a perspective of the power transmission end, a large quantity of power devices such as the IGBT need to be used in a flexible alternating current transmission system (FACTS) during ultrahigh voltage direct current transmission. From a perspective of the power transformation end, the IGBT is a key device of a power electronic transformer (PET). From a perspective of the power consumption end, household white goods, a microwave oven, a light-emitting diode (LED) lighting drive, and the like all have a large demand for the IGBT.

FIG. 1 shows an architecture of a smart grid according to an embodiment of this application, including photovoltaic panels (PV panels), a direct current-direct current (DC-DC) maximum power point tracking (MPPT) system, a direct current link (DC link), a direct current-alternating current inverter (DC-AC inverter), an alternating current filter (AC Filter), and an output end that are sequentially connected. An IGBT device may be disposed in the DC-AC inverter.

The IGBT device has become a mainstream power electronic device in power converters and various auxiliary converters of vehicles of rail transport. An alternating current transmission technology is one of core technologies of modern rail transport. The power converter is a key component in an alternating current transmission system, and the IGBT is one of the core devices of the power converter.

In this embodiment of this application, the insulated gate bipolar transistor may include a first surface A1 and a second surface A2 that are opposite to each other, and in a direction from the first surface A1 to the second surface A2, a front-surface device region 1001, an IGBT drift region 1002, an IGBT buffer region 1003, and an IGBT collector region 1004 are sequentially disposed. The first surface A1 may be used as a front surface of a chip, and the second surface A2 may be used as a back surface of the chip.

Figure 2:
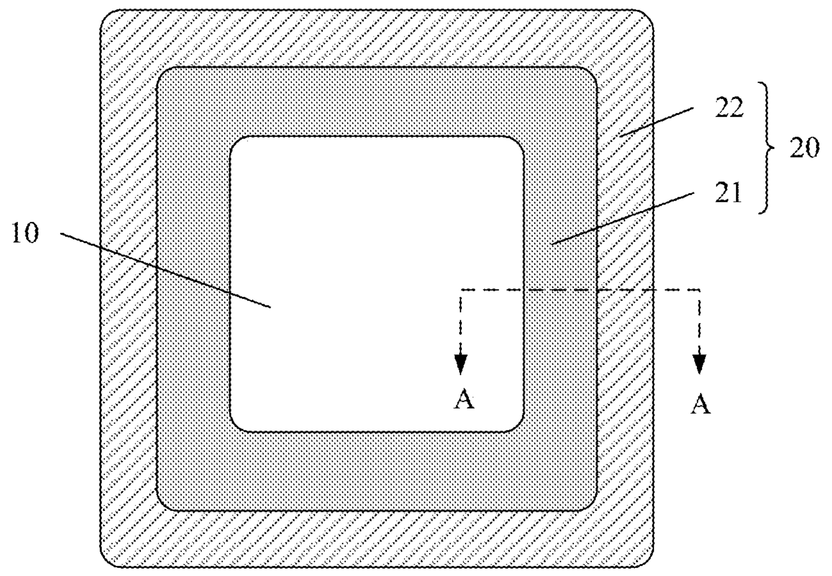
FIG. 2 is a diagram of a structure of an IGBT according to an embodiment of this application.

FIG. 2 is a top view of an IGBT, that is, a diagram of a structure of the front surface of the chip, according to an embodiment of this application.

Figure 3:
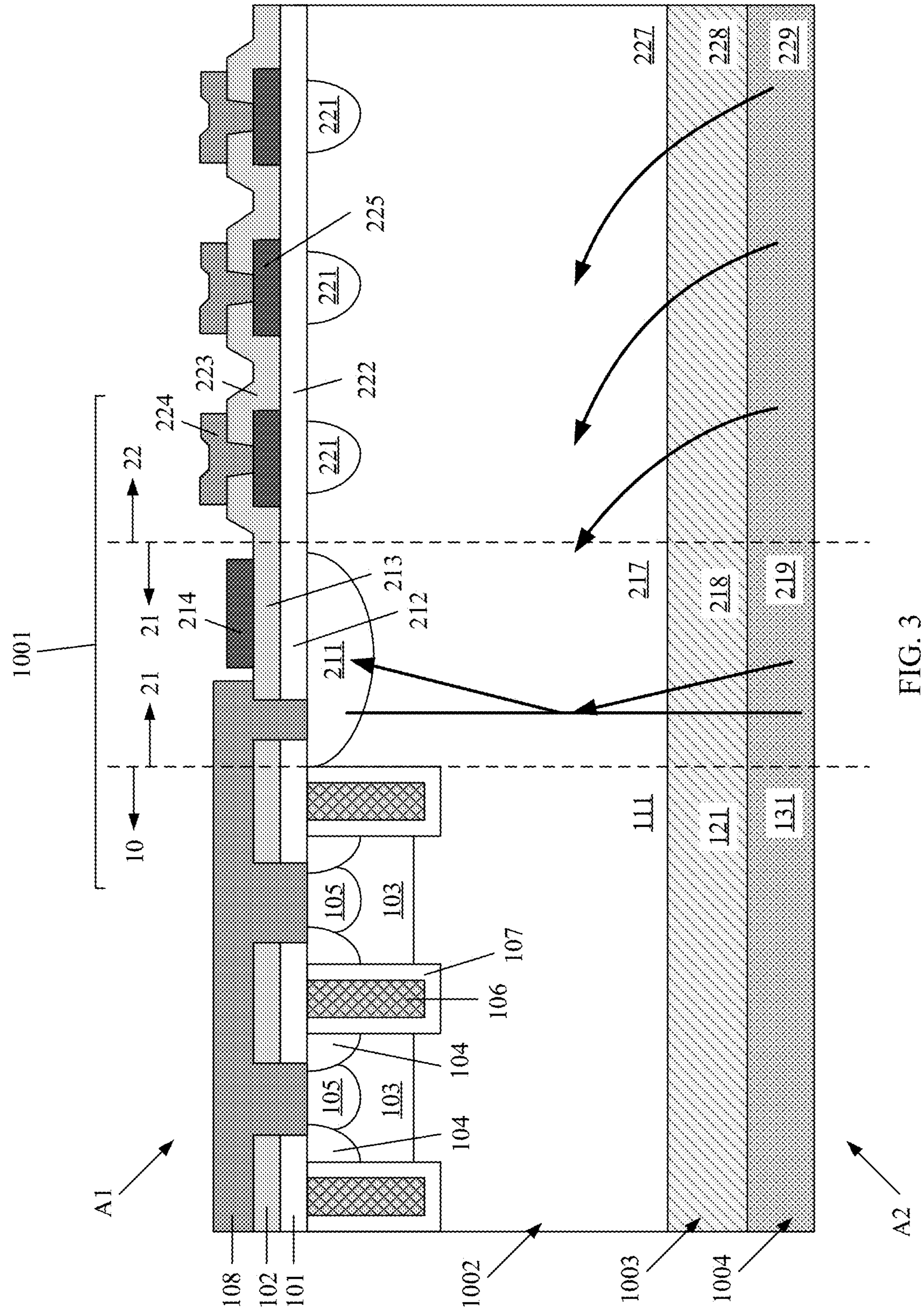
FIG. 3 is a diagram of a structure of another IGBT according to an embodiment of this application.

FIG. 3 is a diagram of a structure of another IGBT according to an embodiment of this application. FIG. 3 may be a sectional view of the IGBT in FIG. 2 along an AA direction. For ease of description, in the following description, the first surface A1 is used as an upper surface, and the second surface A2 is used as a lower surface, that is, a position relationship between "upper" and "lower" is defined. Actually, "upper" and "lower" herein are defined for ease of description, and are related to a placement position of the insulated gate bipolar transistor. Therefore, this description should not be used as a limitation on the structure of the device.

In the field of semiconductor devices, a doping element may be doped into a semiconductor, and types of the doping element may be classified into P-type (hole type, positive) and N-type (electron type, negative). For example, a P-type doping element may be doped into a semiconductor to obtain a P-type semiconductor. In this way, the P-type semiconductor is conductive mainly based on a hole. Alternatively, an N-type doping element is doped into a semiconductor to obtain an N-type semiconductor. In this way, the N-type semiconductor is conductive mainly based on an electron. A concentration of the doping element in the doped semiconductor is used as a doping concentration, which may be expressed by a ratio of the doping element to the semiconductor element, or may be expressed by a quantity of atoms of the doping element per unit of volume. The P-type doping element may be a group III element, such as boron and indium, and the N-type element may be a group V element, such as nitrogen and phosphorus.

Based on the concentration of the doping element in the doped semiconductor, the doping of the semiconductor may be classified into light doping and heavy doping, and correspondingly doped semiconductors are a lightly doped semiconductor and a heavily doped semiconductor.

The light doping means that a quantity of doping elements is small, and a concentration of doping elements in the doped semiconductor is low. For example, a ratio of atoms of the doping element to the semiconductor element is about one per billion. For example, light doping of the P-type doping element in the semiconductor can be expressed as hole-insufficient type (P−-type) doping through which a P−-type semiconductor is obtained, and light doping of the N-type doping element in the semiconductor can be expressed as electron-insufficient type (N−-type) doping through which an N−-type semiconductor is obtained.

The heavy doping means that the quantity of doping elements is large, and a concentration of doping elements in the doped semiconductor is high. For example, a ratio of atoms of the doping element to the semiconductor element is about one per thousand. For example, heavy doping of the P-type doping element in the semiconductor can be expressed as hole-sufficient type (P+-type) doping through which a P+-type semiconductor is obtained, and heavy doping of the N-type doping element in the semiconductor can be expressed as electron-sufficient type (N+-type) doping through which an N+-type semiconductor is obtained.

In this embodiment of this application, the front-surface device region 1001 is located on a side that is of the device and that faces the first surface A1, and includes a cell region 10 and a terminal region 20 surrounding the cell region 10. The terminal region 20 may implement a planar electric field voltage division function of the chip. The terminal region 20 may include a field plate region 21 and a field limiting ring region 22. The field plate region 21 surrounds the cell region 10, and the field limiting ring region 22 surrounds the field plate region 21. As shown in FIG. 3, the cell region 10, the field plate region 21, and the field limiting ring region 22 may be separated by two dashed lines, and the two dashed lines are used to represent boundary positions among the cell region 10, the field plate region 21, and the field limiting ring region 22. Since FIG. 3 is the sectional view, the boundary between the cell region 10 and the field plate region 21 is actually a closed ring, and the boundary between the field plate region 21 and the field limiting ring region 22 is actually a closed ring.

When the IGBT is a planar gate IGBT, the cell region 10 may include a matrix region, a gate region 106, and a gate oxidized region 107. The matrix region includes a base region 103, a first emitting region 104, and a second emitting region 105. The first emitting region 104 and the second emitting region 105 are located on a side that is of the matrix region and that is away from the second surface A2. The first emitting region 104 has a first-type doping element, the second emitting region 105 has a second-type doping element, and the base region 103 has a second-type doping element. The first emitting region 104 is configured to connect to an emitter 108. A concentration of the second-type doping element in the second emitting region is greater than a concentration of the second-type doping element in the base region 103. The gate region 106 and the gate oxidized region 107 may be located on a side that is outside the matrix region and that is away from the second surface A2, and the gate oxidized region 107 is connected to both the first emitting region 104 and the base region 103. For example, the gate oxidized region 107 is located on a side that is of the first emitting region 104 and the base region 103 and that is away from the second surface A2, that is, located above the matrix region. The gate region 106 is located on a side that is of the gate oxidized region 107 and that is away from the second surface A2, that is, located above the gate oxidized region 107. The gate region 106 is configured to connect to a gate electrode and used as a control region of the device.

When the IGBT is a trench gate IGBT, the cell region 10 may include a matrix region, and the matrix region includes a base region 103, a gate region 106, a gate oxidized region 107, a first emitting region 104, and a second emitting region 105. The gate region 106, the gate oxidized region 107, the first emitting region 104, and the second emitting region 105 are located on a side that is of the matrix region and that is away from the second surface A2. The first emitting region 104 has a first-type doping element, the second emitting region 105 has a second-type doping element, and the base region 103 has a second-type doping element. The first emitting region 104 is configured to connect to an emitter 108. A concentration of the second-type doping element in the second emitting region is greater than a concentration of the second-type doping element in the base region 103. In addition, the gate region 106 and the gate oxidized region 107 may be located in the matrix region, the gate oxidized region 107 surrounds the gate region 106 in the matrix region, and the gate oxidized region 107 is connected to both the first emitting region 104 and the base region 103. For example, a side wall of the gate oxidized region 107 is connected to the first emitting region 104 on a side that is away from the second surface A2, and another part of the side wall is connected to the base region 103. The gate region 106 is configured to connect to a gate electrode and used as a control region of the device.

In this embodiment of this application, a cell dielectric layer may be used to cover the first emitting region 104 and the second emitting region 105. The cell dielectric layer may include a first dielectric layer 101 and a second dielectric layer 102 on the first dielectric layer 101. The first dielectric layer 101 covers the first emitting region 104 and the second emitting region 105. The first dielectric layer 101 may be an oxide isolation (LOCOS) layer, and a material of the second dielectric layer 102 may be silicon oxide. When the first emitting region 104 needs to be led out, the first dielectric layer 101 and the second dielectric layer 102 may be etched to obtain an etched hole, and a conductor material is formed in the etched hole. The conductor material may be used as the emitter 108.

The field plate region 21 may include a first field ring region 211, the first field ring region 211 may be connected to the emitter 108, the first field ring region 211 has a second-type doping element, and a field ring dielectric layer is disposed on the first field ring region 211. The field ring dielectric layer includes a third dielectric layer 212 and a fourth dielectric layer 213 on the third dielectric layer 212. The third dielectric layer 212 may be an oxide isolation layer, and a material of the fourth dielectric layer 213 may be silicon oxide. A gate bus 214 may be disposed on the fourth dielectric layer 213, and the gate bus 214 may be connected to the gate electrode of the cell region 10. The field limiting ring region 22 may include a plurality of second field ring regions 221, and a field limiting ring dielectric layer is disposed on the second field ring region 221. The field limiting ring dielectric layer may include a fifth dielectric layer 222 and a sixth dielectric layer 223 on the fifth dielectric layer 222. The fifth dielectric layer 222 may be an oxide isolation layer, and a material of the sixth dielectric layer 223 may be silicon oxide. A control structure 225 and a lead-out structure 224 on the control structure are further disposed on the fifth dielectric layer 222. The lead-out structure 224 may penetrate the sixth dielectric layer 223. A material of the control structure 225 may be polysilicon, and a material of the lead-out structure 224 may be aluminum.

The IGBT drift region 1002 may be disposed on a side that is of the front-surface device region 1001 and that faces the second surface A2, that is, the IGBT drift region 1002 is located below the front-surface device region 1001, and the IGBT drift region 1002 is connected to the front-surface device region 1001. For example, the IGBT drift region 1002 is connected to the base region 103 of the cell region 10, to the first field ring region 211 of the field plate region 21, and to the second field ring region 221 of the field limiting ring region 22. The IGBT drift region 1002 may further be connected to the gate oxidized region of the cell region 10. The IGBT drift region 1002 may have a first-type doping element. A part of the IGBT drift region 1002 located on a side that is of the cell region 10 and that faces the second surface A2 may be denoted as a first drift region 111, a part of the IGBT drift region 1002 located on a side that is of the field plate region 21 and that faces the second surface A2 may be denoted as a second drift region 217, and a part of the IGBT drift region 1002 located on a side that is of the field limiting ring region 22 and that faces the second surface A2 may be denoted as a third drift region 227. In other words, the first drift region 111 is located below the cell region 10, and the first drift region 111 coincides with a projection of the cell region 10 on the first surface A1. The second drift region 217 is located below the field plate region 21, and the second drift region 217 coincides with a projection of the field plate region 21 on the first surface A1. The third drift region 227 is located below the field limiting ring region 22, and the third drift region 227 coincides with a projection of the field limiting ring region 22 on the first surface A1. Refer to FIG. 3. The cell region 10 and the first drift region are located on a same side of the dashed line, the field plate region 21 and the second drift region 217 are located on a same side of the dashed line, and the field limiting ring region 22 and the third drift region 227 are located on a same side of the dashed line. The dashed line is introduced for ease of description. Actually, there may be no obvious boundary among the first drift region 111, the second drift region 217, and the third drift region 227.

The IGBT buffer region 1003 may be disposed on a side that is of the IGBT drift region 1002 and that faces the second surface A2, that is, the IGBT buffer region 1003 is located below the IGBT drift region 1002, and the IGBT buffer region 1003 is connected to the IGBT drift region 1002. The IGBT buffer region 1003 has a first-type doping element, that is, the doping element is of a same type as the doping element of the IGBT drift region 1002. In addition, a concentration of the first-type doping element in the IGBT buffer region 1003 is greater than a concentration of the first-type doping element in the IGBT drift region 1002, and the IGBT buffer region 1003 may be used as a field stop layer to improve performance of the IGBT. A part of the IGBT buffer region 1003 located on a side that is of the first drift region 111 and that faces the second surface A2 is denoted as a first buffer region 121, a part of the IGBT buffer region 1003 located on a side that is of the second drift region 217 and that faces the second surface A2 is denoted as a second buffer region 218, and a part of the IGBT buffer region 1003 located on a side that is of the third drift region 227 and that faces the second surface A2 is denoted as a third buffer region 228. In other words, the first buffer region 121 is located below the first drift region 111, and the first buffer region 121 coincides with the projection of the cell region 10 on the first surface A1. The second buffer region 218 is located below the second drift region 217, and the second buffer region 218 coincides with the projection of the field plate region 21 on the first surface A1. The third buffer region 228 is located below the third drift region 227, and the third buffer region 228 coincides with the projection of the field limiting ring region 22 on the first surface A1. Refer to FIG. 3. The first buffer region 121, the cell region 10, and the first drift region are located on a same side of the dashed line. The second buffer region 218, the field plate region 21, and the second drift region 217 are located on a same side of the dashed line, and the third buffer region 228, the field limiting ring region 22, and the third drift region 227 are located on a same side of the dashed line. Actually, there may be no obvious boundary among the first buffer region 121, the second buffer region 218, and the third buffer region 228.

The IGBT collector region 1004 may be disposed on a side that is of the IGBT buffer region 1003 and that faces the second surface A2, that is, the IGBT collector region 1004 is located below the IGBT buffer region 1003. The IGBT collector region 1004 is connected to the IGBT buffer region 1003 and is configured to connect to a collector. The IGBT collector region 1004 may have a second-type doping element, that is, the doping element is of an opposite type to the doping element of the IGBT buffer region 1003. A part of the IGBT collector region 1004 located on a side that is of the first buffer region 121 and that faces the second surface A2 may be denoted as a cell collector region 131, a part of the IGBT collector region 1004 located on a side that is of the terminal region 20 and that faces the second surface A2 may be denoted as a terminal collector region, in the terminal collector region, a part of the IGBT collector region 1004 located on a side that is of the second buffer region 218 and that faces the second surface A2 may be denoted as a field plate collector region 219, and a part of the IGBT collector region 1004 located on a side that is of the third buffer region 228 and that faces the second surface A2 may be denoted as a field limiting ring collector region 229. In other words, the cell collector region 131 is located below the first buffer region 121, and the cell collector region 131 coincides with the projection of the cell region 10 on the first surface A1. The terminal collector region is located below the second buffer region 218 and the third buffer region 228, and the terminal collector region coincides with a projection of the terminal region 20 on the first surface A1. The field plate collector region 219 in the terminal collector region is located below the second buffer region 218, and the field plate collector region 219 coincides with the projection of the field plate region 21 on the first surface A1. The field limiting ring collector region 229 is located below the third buffer region 228, and the field limiting ring collector region 229 coincides with the projection of the field limiting ring region 22 on the first surface A1. Refer to FIG. 3. The cell collector region 131, the first buffer region 121, the cell region 10, and the first drift region are located on a same side of the dashed line, the field plate collector region 219, the second buffer region 218, the field plate region 21, and the second drift region 217 are located on a same side of the dashed line, and the field limiting ring collector region 229, the third buffer region 228, the field limiting ring region 22, and the third drift region 227 are located on a same side of the dashed line. Actually, there may be no obvious boundary among the cell collector region 131, the field plate collector region 219, and the field limiting ring collector region 229.

The IGBT buffer region 1003 is disposed between the IGBT drift region 1002 and the IGBT collector region 1004, and may be used as a field stop layer, so that the IGBT is a field stop IGBT (FS-IGBT). The field stop layer has three functions: (1) Stop a forward electric field. Compared with a structure without the field stop layer, a structure with the field stop layer with a same thickness can withstand a larger voltage drop. (2) Reduce a thickness of the drift region, implement thinning, and reduce a conduction loss. (3) Reduce storage space of injecting minority carriers, namely holes, and reduce turn-off time and a turn-off loss.

The first-type doping element and the second-type doping element are doping elements of different types, which are the P type and the N type respectively. A semiconductor doped with the first-type doping element has a first conductivity type, a semiconductor doped with the second-type doping element has a second conductivity type, and the first conductivity type and the second conductivity type are different conductivity types. A conductivity type of a semiconductor doped with the P-type doping element is the P type, and a conductivity type of a semiconductor doped with the N-type doping element is the N type. As an example, the first conductivity type may be the N type, and the second conductivity type may be the P type. In this case, a conductivity type of the base region 103 is P, a conductivity type of the first emitting region 104 is N, a conductivity type of the second emitting region 105 is P, conductivity types of the first field ring region 211 and the second field ring region 221 each are the P type, a conductivity type of the IGBT drift region 1002 is N, a conductivity type of the IGBT buffer region 1003 is N, and a conductivity type of the IGBT collector region 1004 is P.

The base region 103, the first emitting region 104, the second emitting region 105, the first field ring region 211, the second field ring region 221, the IGBT drift region 1002, the IGBT buffer region 1003, and the IGBT collector region 1004 may be different positions on the substrate and obtained through doping in different positions. The doping of the base region 103 may be the light doping and is indicated by P−, the doping of the first emitting region 104 and the second emitting region 105 may be the heavy doping and are respectively indicated by N+ and P+, the doping of the IGBT drift region 1002 may be the light doping and is indicated by N−, and the doping of the IGBT buffer region 1003 may be the heavy doping and is indicated by N+. A doping concentration range may be 1E12 to 1E13. The collector, the gate electrode, and the emitter 108 form three electrode ports of the IGBT. When the IGBT works normally, a conductive channel is formed on a surface of the base region 103 of the cell region. The conductive channel is formed close to a boundary of the gate oxidized region 107. One side of the conductive channel is the first emitting region 104, and the other side of the conductive channel is the first drift region 111. Electrons flow from the emitter 108 to the collector through the first drift region 111. Due to requirements of a forward bias and electric neutrality of the collector, a large quantity of holes are continuously injected from the collector into the first drift region 111, some holes and electrons in the first drift region 111 form conductivity modulation, and remaining holes diffuse to a junction position formed by the base region 103 and the first drift region 111, and are finally collected by the emitter 108. In this case, an external performance of the IGBT is that a load current exists and the IGBT is in a turn-on state. Because of the conductivity modulation effect of the IGBT in forward conduction, the IGBT has advantages of a low forward conduction voltage drop, a large on-state current, and a small loss.

Figure 4:
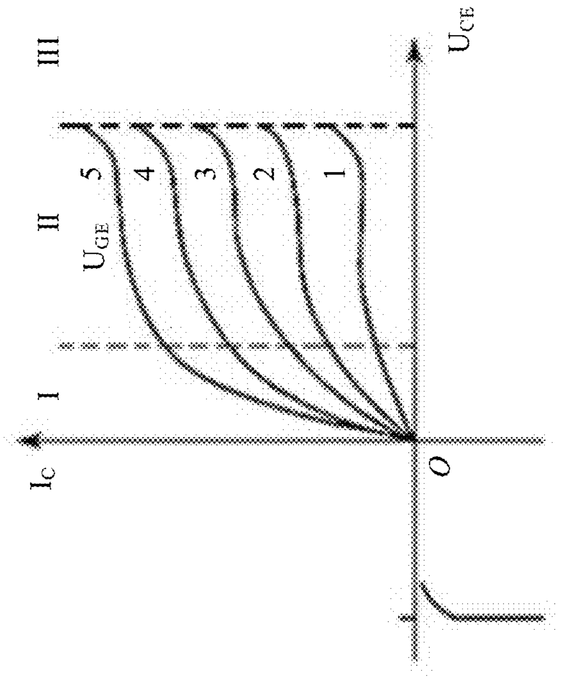
FIG. 4 is a diagram of a static characteristic of an IGBT according to an embodiment of this application.
Figure 4:
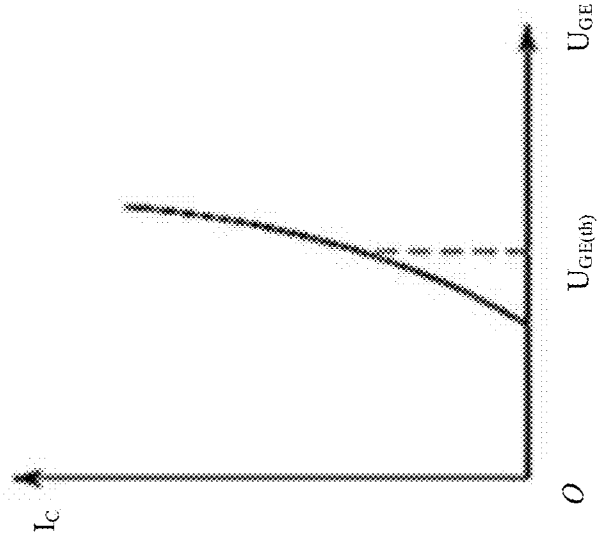

FIG. 4 is a diagram of a static characteristic of an IGBT according to an embodiment of this application. The static characteristic of the IGBT mainly includes a transfer characteristic and an output characteristic.

The transfer characteristic of the IGBT is used to describe a relationship between an IGBT collector current $I_C$ and a gate-emitter voltage $V_{GE}$ ($U_{GE}$). FIG. 4A shows a transfer characteristic curve of an IGBT according to an embodiment of this application. A horizontal coordinate is $U_{GE}$, a vertical ordinate is $I_C$, and a turn-on voltage $U_{GE(th)}$ is a lowest gate-emitter voltage the IGBT conducts when the IGBT can implement conductivity modulation. When $U_{GE}$ is greater than the turn-on voltage, the IGBT is turned on to have a positive $I_C$, and $I_C$ gradually increases with $U_{GE}$.

The output characteristic of the IGBT, also referred to as a current-voltage characteristic, describes a relationship between the collector current $I_C$ and a collector-emitter voltage $V_{CE}$ ($U_{CE}$) when the gate-emitter voltage is a parameter. FIG. 4B shows an output characteristic curve of an IGBT according to an embodiment of this application. A horizontal coordinate is $U_{CE}$, and a vertical coordinate is $I_C$. Distribution of different curves (1, 2, 3, 4, and 5) corresponds to sequentially increasing $U_{GE}$. The output characteristic of the IGBT is divided into three regions: forward blocking region III, active region II, and saturation region I. When the IGBT is in the forward blocking region, IGBT is cut off. When the IGBT is in the active region, $I_C$ increases with an increase of $U_{CE}$ and an increase of $U_{GE}$, and $I_C$ increases slightly with UCH. When the IGBT is in the saturation region I, $I_C$ increases with the increase of $U_{CE}$ and the increase of $U_{GE}$, and $I_C$ increases sharply. When $V_{CE}$ ($U_{CE}$)<0, the IGBT is in a reverse blocking state. In a power electronic circuit, the IGBT operates in an on/off state, and switches between the forward blocking region III and the saturation region I.

Figure 5:
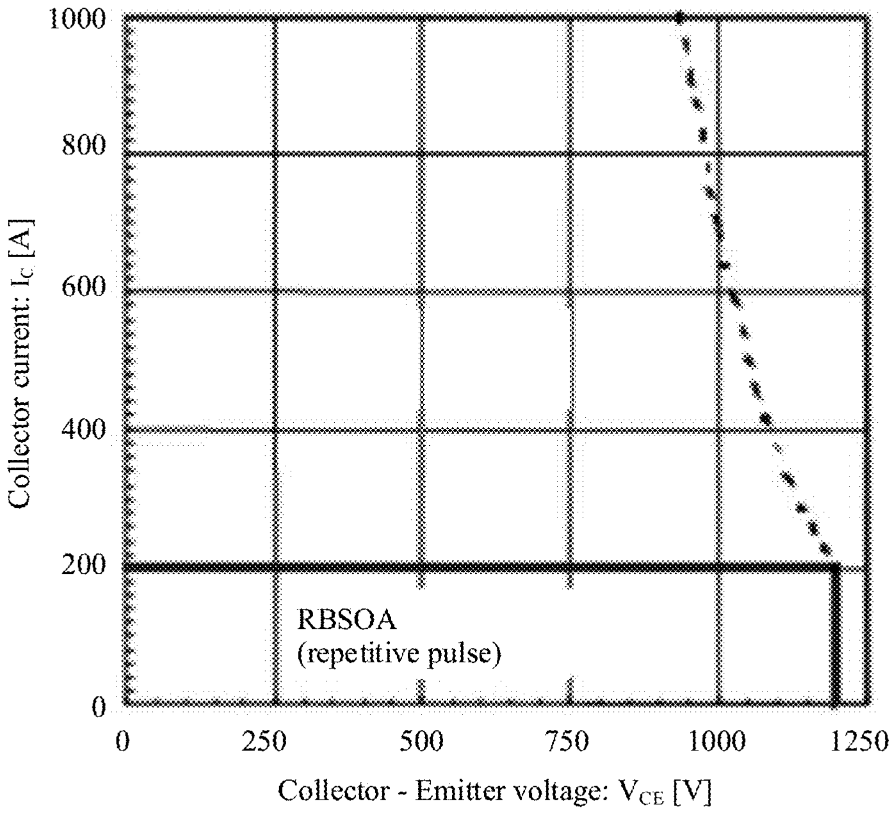
FIG. 5 is a diagram of a safe operation area of an IGBT according to an embodiment of this application.

FIG. 5 is a diagram of a safe operation area of an IGBT according to an embodiment of this application. A horizontal coordinate is a collector-emitter voltage $V_{CE}$ ($U_{CE}$), a vertical coordinate is $I_C$. The safe operation area (SOA) reflects a capability of a power device to simultaneously withstand a specific voltage and current. A reverse bias safe operation area (RBSOA) is determined by a reverse maximum collector current, a maximum collector-emitter voltage and a maximum allowable voltage rise rate $dV_{CE}/dt$. It can be seen from the figure that under the action of a repetitive pulse, the RBSOA is in a region range of $I_C \leq 200$ V and $V_{CE} \leq 1200$ V, which indicates a turn-off transient state when a gate bias is zero or negative but exists because a hole current does not disappear.

The IGBT also has specific performance parameters, which are required to be within a range of minimum or maximum limit capabilities or limit conditions of the parameters in a use process. The parameters cannot exceed a highest or lowest rate value in an operating process of the IGBT. The main parameters are as follows:

Collector-Emitter blocking voltage ($BV_{CES}$) indicates a maximum voltage between the collector and the emitter when a short circuit occurs between a gate and the emitter.

Gate-Emitter voltage (VGES) indicates a maximum voltage between the gate and the emitter when a short circuit occurs between the collector and the emitter.

Continuous collector current ($I_C$) indicates a maximum direct current allowed by the collector, and is usually a direct current value required for a junction temperature to rise from a case temperature of 25° C. to a maximum junction temperature of 150° C.

Peak collector repetitive current (ICM) usually indicates, under a transient condition, a peak current that the IGBT can withstand and that is higher than a maximum continuous current of the IGBT.

Maximum power dissipation (PD) is a parameter indicating power dissipation required to raise the junction temperature to the maximum of 150° C. at the case temperature of 25° C.

Junction temperature (Tj) indicates an allowable range of the IGBT junction temperature during operation.

Collector-Emitter leakage current (ICES) indicates a leakage current when a short circuit occurs between the gate and the emitter and when a specified voltage and a specific temperature are applied between the collector and emitter.

Gate-Emitter threshold voltage (VGE(th)) is a parameter defining a gate-emitter voltage range within which the IGBT is turned on. The threshold voltage has a negative temperature coefficient. The threshold voltage linearly increases with a thickness of a gate oxidized layer, and is directly proportional to a square root of a doping concentration of a P-type base region. A fixed surface charge in an interface between oxide and silicon and a moveable ion at the gate oxidized layer may cause an offset of the threshold voltage.

Collector-Emitter saturation voltage (VCE (SAT)) indicates a voltage between the collector and the emitter at a specified collector current and a specified gate voltage.

Input capacitance (Cies) indicates a measured gate-emitter capacitance when a short circuit occurs between the collector and the emitter. The input capacitance is a sum of a gate-emitter capacitance and a Miller capacitance. The gate-emitter capacitance is much greater than the Miller capacitance.

Output capacitance (Coes) indicates a capacitance between the collector and the emitter when a short circuit occurs between the gate and the emitter, with typical PN junction voltage dependence.

Reverse transfer capacitance (Cres) indicates a Miller capacitance between the gate and the collector, with complex voltage dependence.

An IGBT with a field stop layer has a problem that a withstand voltage characteristic is poor, and the withstand voltage characteristic includes a maximum reverse withstand voltage level that can be withstood by the IGBT, which may be reflected by a $BV_{CES}$. The $BV_{CES}$ is a maximum reverse withstand voltage that can be withstood between the collector and the emitter under the action of a specified current between the collector and the emitter when the short circuit occurs between the gate and the emitter. A larger maximum reverse withstand voltage indicates a better withstand voltage characteristic of the device.

As the current between the collector and the emitter increases, the maximum reverse withstand voltage also increases. However, when the maximum reverse withstand voltage exceeds an avalanche resistance of the device, a snap back phenomenon occurs in the $BV_{CES}$. In this case, as the current increases, if the maximum reverse withstand voltage decreases, that is, BV negative resistance effect is displayed, a large leakage current occurs in the terminal region 20 of the device. As the current further increases, an amplification factor of the device increases. Under the negative feedback, the device is damaged and finally burnt.

Figure 6:
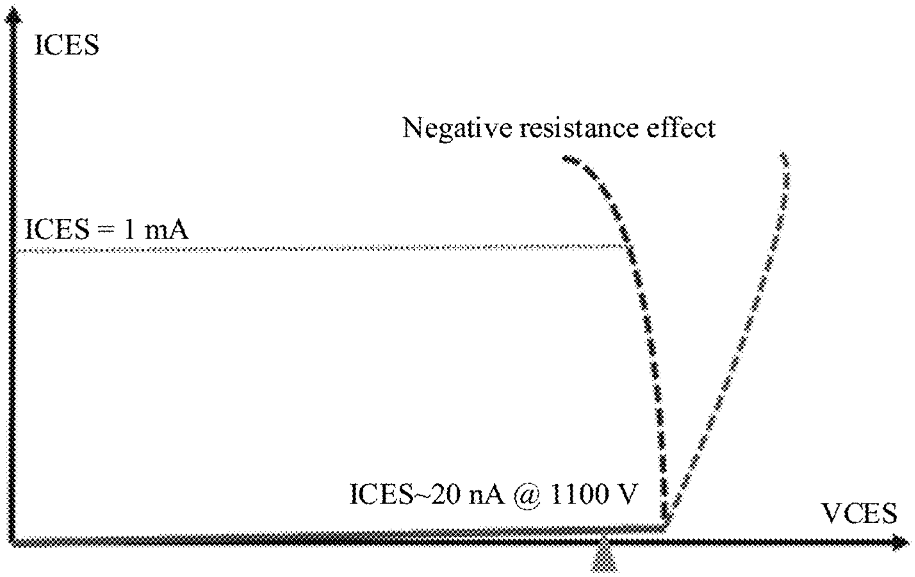
FIG. 6 is a diagram of a negative resistance phenomenon according to an embodiment of this application.

FIG. 6 is a diagram of negative resistance effect according to an embodiment of this application. A horizontal coordinate is VCES, and a vertical coordinate is ICES. When ICES is 20 nA, VCES is 1100 V (a location of a triangle). When the maximum reverse withstand voltage exceeds the avalanche resistance of the device, the maximum reverse withstand voltage decreases with the increase of the current. Refer to a dashed line on the left. When ICES increases to 1 mA, VCES snaps back from 1100 V to 1000 V. After the BV negative resistance effect occurs, an SOA characteristic decreases accordingly. When there is no $BV_{CES}$ snap back phenomenon, that is, there is no BV negative resistance effect, the maximum reverse withstand voltage increases with the increase of the current, as shown by a dashed line on the right.

In the reverse withstand voltage, an amplification factor of a PNP transistor is inversely correlated with a diffusion coefficient DE of an emitting region/a width WB of a base region/an injection dosage NB of the base region, and is positively correlated with a diffusion coefficient DB of the base region/a width WE of the emitting region/an injection dosage NE of the emitting region, as shown in the following formula:

$$\alpha = 1 - \frac{D_E W_B N_B}{D_B W_E N_E} \quad (1)$$

The emitting region of the PNP transistor may be used as the IGBT collector region. Therefore, the width of the base region may be reduced by reducing the injection dosage of the emitting region of the PNP transistor or increasing the injection dosage and/or width of the base region of the PNP transistor, to reduce the amplification factor of the PNP transistor. In other words, a width of the base region of the IGBT may be reduced by reducing an injection dosage of the IGBT collector region 1004 or increasing a doping concentration/width of the IGBT buffer region 1003, to reduce the amplification factor of the IGBT, and suppress the negative resistance. However, adjustment of this solution changes integrity of the device, and the reduction of the amplification factor also affects an overall BV withstand voltage level, or increase a saturation voltage of the device, which results in an increase in an on-state loss. When hole injection is performed on a back surface of the IGBT, the hole injection is performed on the entire back surface region, and ion concentrations injected in all regions are completely the same.

Currently, when the hole injection is performed on the back surface of the cell region 10, each cell region 10 can further be divided into two sides on which injection of holes with different concentrations is performed, thereby reducing a leakage current between the emitter 108 and the collector and reducing a turn-off loss. An RBSOA (reverse bias safe operation area) characteristic of the product is improved. A disadvantage of this technology lies in that although half-side partitioning is performed on each cell, after the differential hole injection, a saturation voltage drop of the device is pulled up due to thin P-type injection on the other half side of the cell region 10, which increases a static loss.

In the IGBT, the IGBT collector region 1004 and the IGBT buffer region 1003 are doped with different types of doping elements, and a PN junction is formed at an interface between the IGBT collector region 1004 and the IGBT buffer region 1003. A distance between a surface that is of the IGBT collector region 1004 and that is away from the IGBT buffer region 1003 and the PN junction is used as a junction depth of the PN junction, and the junction depth of the PN junction is deeply affected by a doping concentration of the IGBT collector region 1004 and a thickness of the PN junction. With a given doping concentration of the IGBT collector region 1004, a thinner PN junction indicates a deeper junction depth of the PN junction and that the PN junction is more prone to breakdown. For the PN junction between the IGBT collector region 1004 and the IGBT buffer region 1003, a structural characteristic of the IGBT makes a junction depth of the terminal region 20 deeper than a junction depth of the cell region 10, and in the reverse withstand voltage, an electric field breakdown point is concentrated at the PN junction of the terminal region 20. Refer to FIG. 3. Electric field distribution in the device can be indicated by solid lines with arrows when the reverse withstand voltage is withstood vertically. The PN junction of the terminal region 20 is more prone to breakdown when both horizontal and vertical breakdown paths exist in a region at which the PN junction of the terminal region 20 is located. Due to an intrinsic characteristic of the IGBT, there is a parasitic PNP triode in a vertical direction. However, the concentration of the hole injection on the back surface directly affects the saturation voltage drop (VCESAT). Hole injection with an excessively high concentration on the back surface makes the PN junction thinner. As an amplification factor of the triode increases, the snapback of the device is intensified, which results in the negative resistance effect of BV breakdown, and finally affects performance of the device.

In addition, a region under the field plate region 21 is a region in which an electric field strength is most concentrated, and leakage current control for the region can effectively control an overall leakage current of the device. Therefore, according to a breakdown characteristic of the parasitic transistor, an injection dosage of the region under the field plate region 21 of PNP can be adjusted to reduce a hole injection concentration of the field plate collector region 219, so that a concentration of a second-type doping element in the cell collector region 131 is larger than a concentration of a second-type doping element in the field plate collector region 219. Based on the functional relationship between the amplification factor of the PNP transistor and the emitting region and the base region, it can be learned that reducing the injection dosage of the P collector under the field plate region 21 can reduce the amplification factor of the triode in the field plate region 21 in a targeted manner. In other words, in this embodiment of this application, holes of different concentrations are injected into the cell collector region 131 and the field plate collector region 219, and local leakage current control is performed, to reduce the amplification factor. Therefore, a voltage withstand capability of the device can be improved, the BV negative resistance phenomenon can be eliminated, and reliability of the device can be improved without affecting a level of the saturation voltage drop of the device.

The terminal collector region may have a uniform concentration of the second-type doping element, that is, the concentration of the second-type doping element in the field plate collector region 219 is equal to a concentration of a second-type doping element in the field limiting ring collector region 229. In this case, the concentration of the second-type doping element in the cell collector region 131 is greater than the concentration of the second-type doping element in the field plate collector region 219 and is greater than the concentration of the second-type doping element in the field limiting ring collector region 229.

Figure 7:
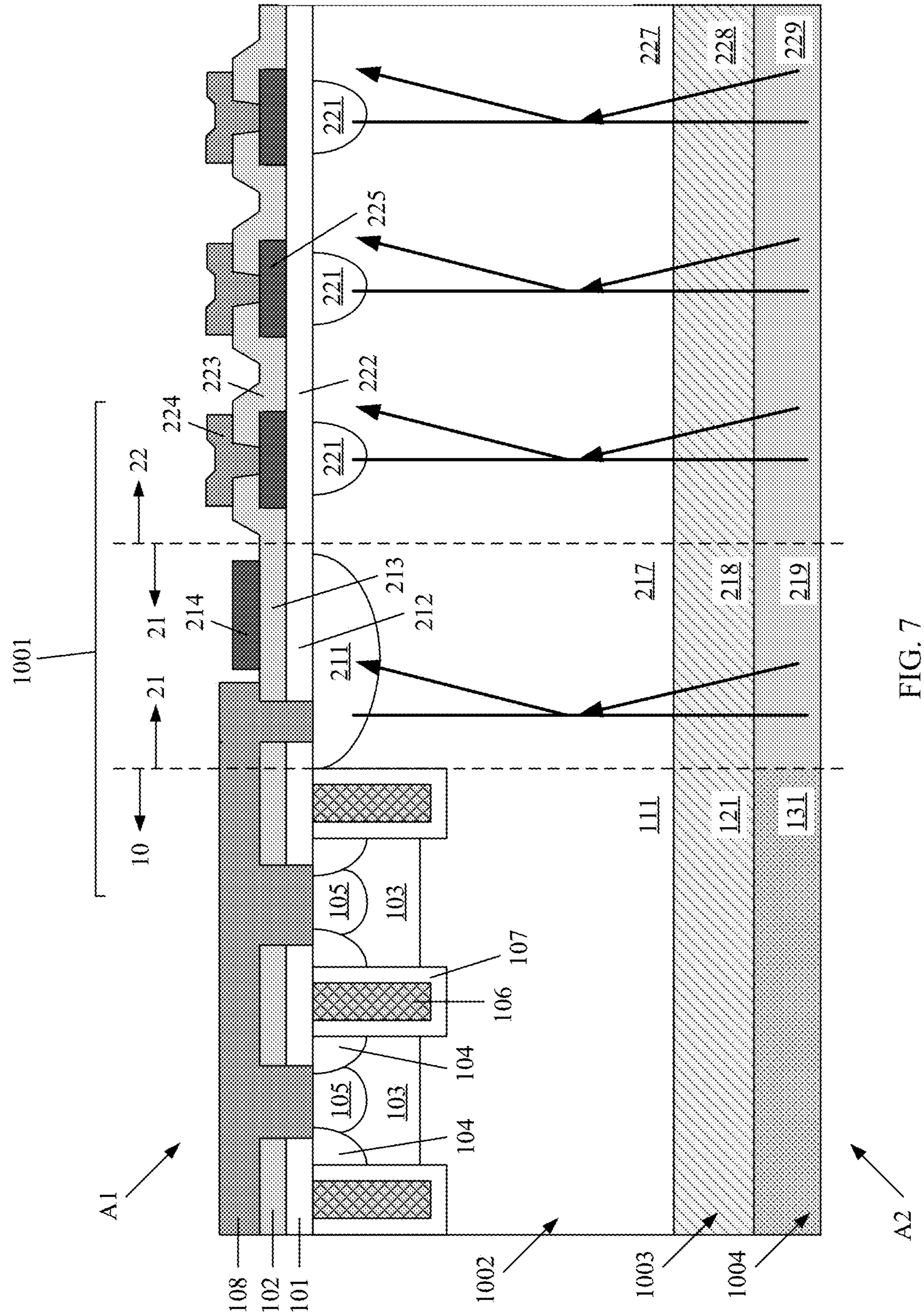
FIG. 7 is a diagram of a structure of still another IGBT according to an embodiment of this application.

FIG. 7 is a diagram of a structure of still another IGBT according to an embodiment of this application. Electric field distribution in the device can be indicated by solid lines with arrows when the reverse withstand voltage is withstood vertically. When the concentration of the second-type doping element in the field plate collector region 219 and the field limiting ring collector region 229 is low, horizontal breakdown paths of a region in which a PN junction between the field plate collector region 219 and the second buffer region 218 is located, and a region in which a PN junction between the field limiting ring collector region 229 and the third buffer region 228 are suppressed and less prone to breakdown. Correspondingly, when the concentration of the second-type doping element in the field plate collector region 219 and the field limiting ring collector region 229 is low, this helps increase a thickness of a PN junction between the field plate collector region 219 and the first buffer region 121 and a thickness of the PN junction between the field limiting ring collector region 229 and the second buffer region 218, and reduce a junction depth of a PN junction between the terminal collector region and the IGBT buffer region 1003 and make the PN junction there less prone to breakdown. For example, the doping of the cell collector region 131 is the heavy doping, and the doping concentration range is 1E13 to 1E14 $cm^{-3}$ (that is, $10^{12}$ to $10^{14}$ $cm^{-3}$), and the doping of the field plate collector region 219 and the field limiting ring collector region 229 is the light doping, and the doping concentration range 1E12 to 1E13 (that is, $10^{12}$ to $10^{13}$ $cm^{-3}$).

The terminal collector region may have a non-uniform concentration of the second-type doping element. For example, the concentration of the second-type doping element in the field plate collector region 219 is less than the concentration of the second-type doping element in the field limiting ring collector region 229, but the concentration of the second-type doping element in the cell collector region 131 is greater than the concentration of the second-type doping element in the field plate collector region 219. In addition, the concentration of the second-type doping element in the cell collector region 131 may be greater than or equal to the concentration of the second-type doping element in the field limiting ring collector region 229.

Figure 8:
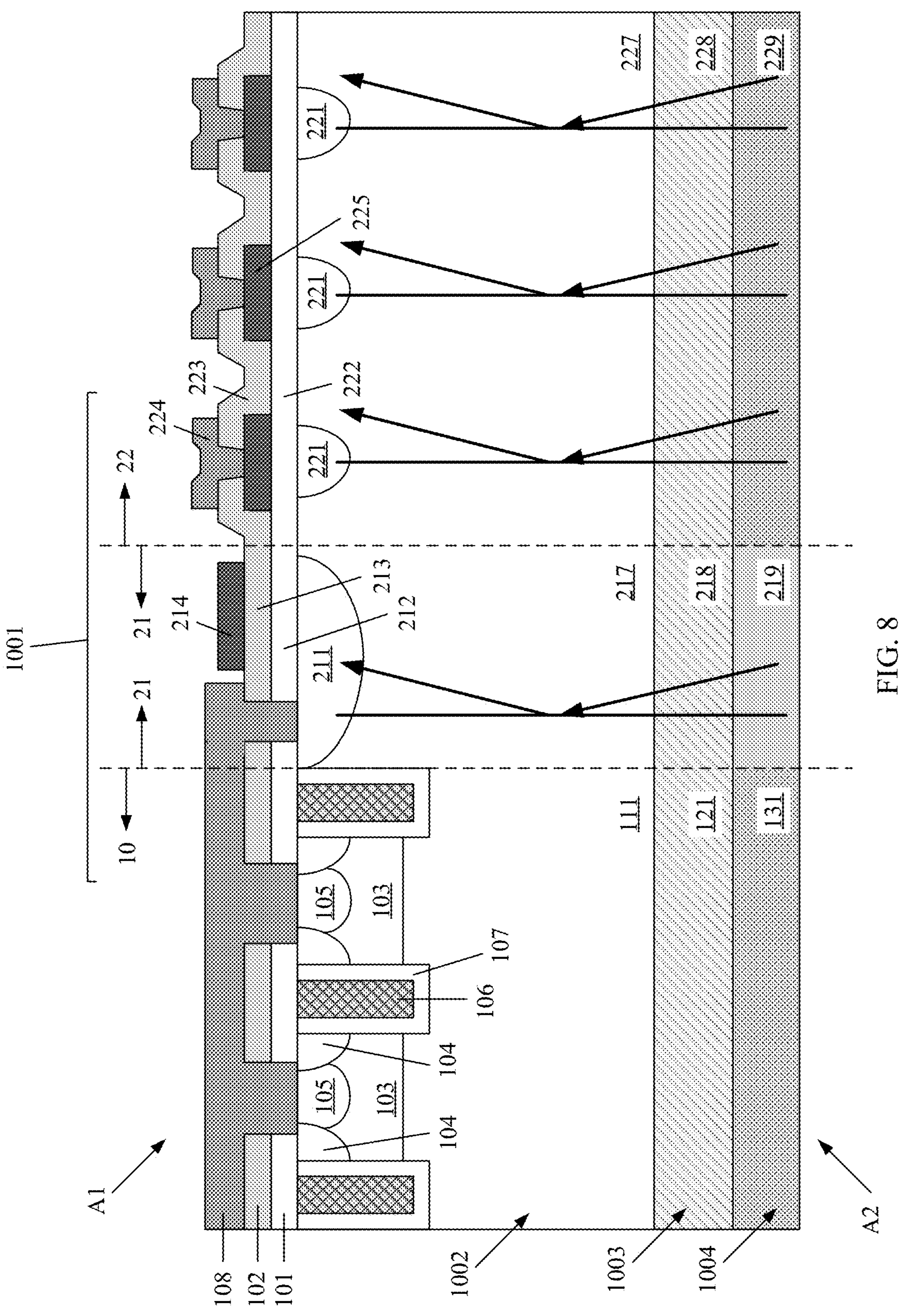
FIG. 8 is a diagram of a structure of yet another IGBT according to an embodiment of this application.

FIG. 8 is a diagram of a structure of yet another IGBT according to an embodiment of this application. Electric field distribution in the device can be indicated by solid lines with arrows when the reverse withstand voltage is withstood vertically. When the concentration of the second-type doping element in the field plate collector region 219 is low, the horizontal breakdown path in the region in which the PN junction between the field plate collector region 219 and the second buffer region 218 is located is suppressed and less prone to breakdown. Correspondingly, when the concentration of the second-type doping element in the field plate collector region 219 is low, this helps increase a width of the PN junction between the field plate collector region 219 and the first buffer region 121, reduce a junction depth of the PN junction, and make the PN junction there less prone to breakdown. For example, the doping of the cell collector region 131 and the field limiting ring collector region 229 is the heavy doping, and the concentration range of the second-type doping element is 1E13 to 1E14 $cm^{-3}$ (that is, $10^{12}$ to $10^{14}$ $cm^{-3}$), and the doping of the field plate collector region 219 is the light doping, and the concentration range of the second-type doping element is 1E12 to 1E13 $cm^{-3}$ (that is, $10^{12}$ to $10^{13}$ $cm^{-3}$).

An embodiment of this application provides an insulated gate bipolar transistor IGBT. The IGBT includes a first surface and a second surface that are opposite to each other, and in a direction from the first surface to the second surface, a front-surface device region, an IGBT drift region, an IGBT buffer region, and an IGBT collector region are sequentially connected. The front-surface device region may include a cell region and a terminal region surrounding the cell region, and the terminal region includes a field plate region surrounding the cell region and a field limiting ring region surrounding the field plate region. The IGBT drift region has a first-type doping element, the IGBT buffer region has a first-type doping element, and a concentration of the first-type doping element in the IGBT buffer region is greater than a concentration of the first-type doping element in the IGBT drift region. The IGBT collector region includes a cell collector region, a field plate collector region, and a field limiting ring collector region. The cell collector region coincides with a projection of the cell region on the first surface, the field plate collector region coincides with a projection of the field plate region on the first surface, and the field limiting ring collector region coincides with a projection of the field limiting ring region on the first surface. The IGBT collector region has a second-type doping element, and when a concentration of a second-type doping element in the cell collector region is equal to a concentration of a second-type doping element in the field plate collector region, the field plate region is more prone to breakdown than the cell region. In this way, the concentration of the second-type doping element in the cell collector region can be designed to be greater than the concentration of the second-type doping element in the field plate collector region. In other words, a part of the collector region opposite to the cell region has a second-type doping element with a larger concentration, and a part of the collector region opposite to the field plate region has a second-type doping element with a smaller concentration. This effectively reduces an amplification factor of a parasitic triode in the field plate region, reduces a leakage current value of the device when the device withstands a reverse withstand voltage, improves a withstand voltage characteristic and a safe operation area characteristic of the device, enhances robustness of the device, and improves overall operating performance of the device.

Figure 9:
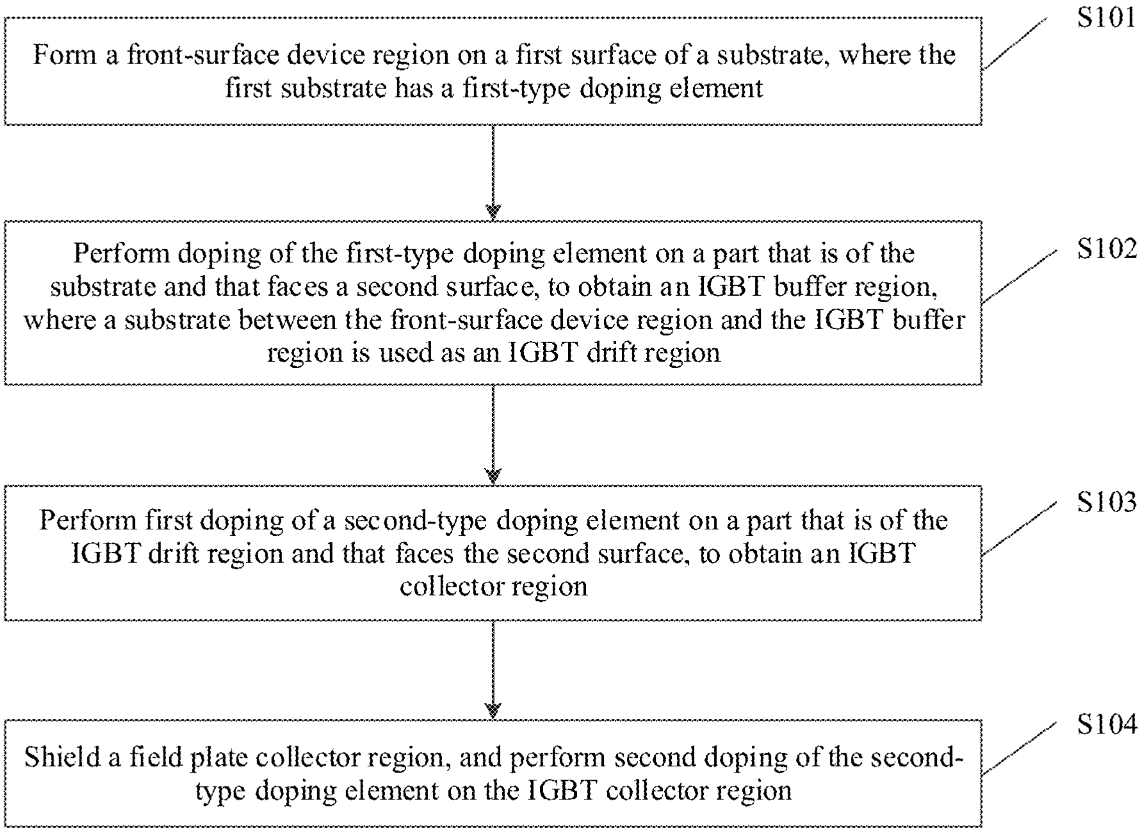
FIG. 9 is a flowchart of an IGBT manufacturing method according to an embodiment of this application.

Based on the IGBT provided in this embodiment of this application, an embodiment of this application further provides an IGBT manufacturing method. FIG. 9 is a flowchart of an IGBT manufacturing method according to an embodiment of this application. The method may include the following steps.

Figure 10:
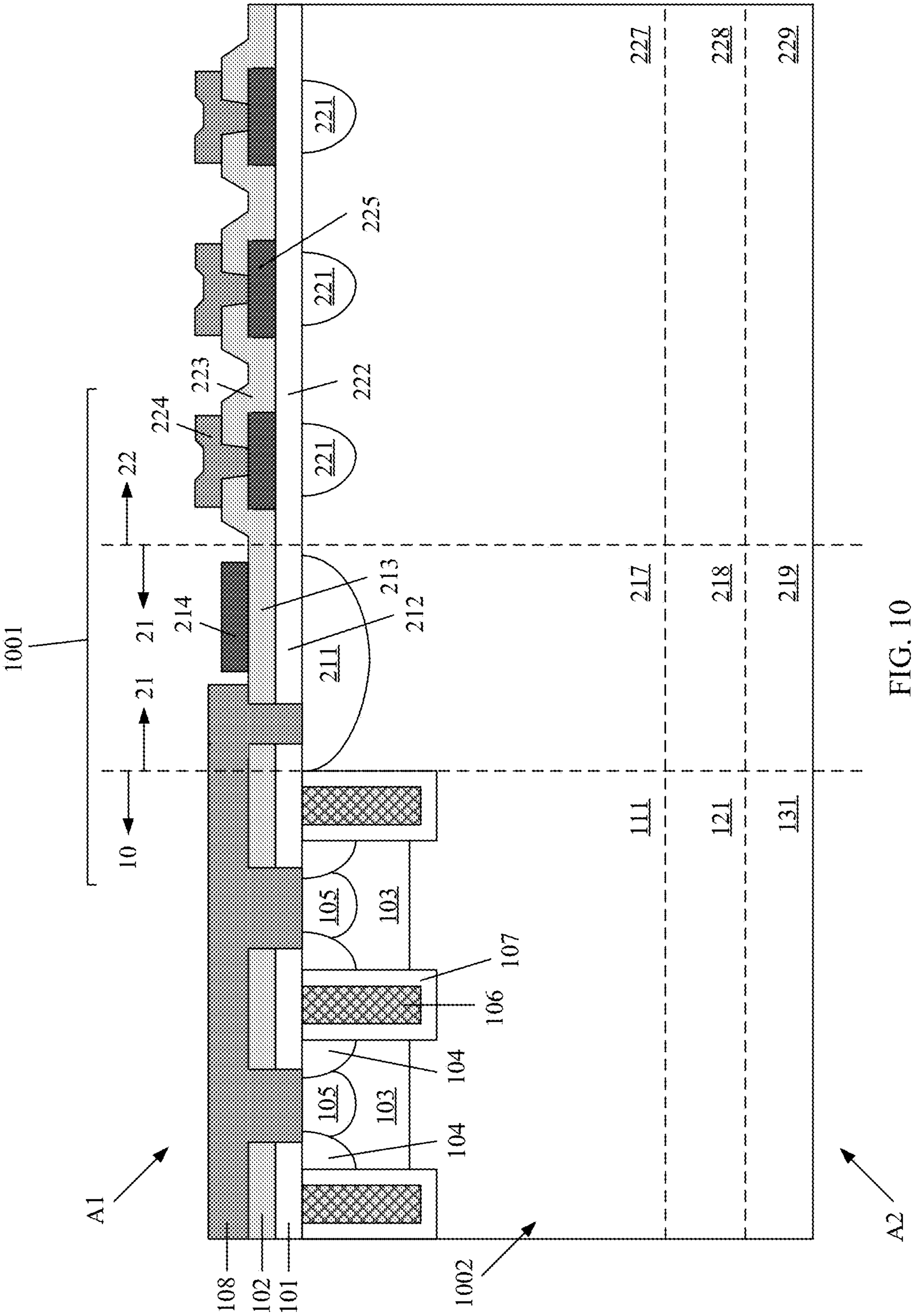
FIG. 10 to FIG. 14 are diagrams of a structure of an IGBT in a manufacturing process according to an embodiment of this application.

S101: Form a front-surface device region 1001 on a first surface of a substrate, where the substrate has a first-type doping element, as shown in FIG. 10.

In this embodiment of this application, the insulated gate bipolar transistor may include a first surface A1 and a second surface A2 that are opposite to each other. The first surface A1 may be used as a front surface of a chip, and the second surface A2 may be used as a back surface of the chip. The substrate may be a semiconductor substrate, a P-type semiconductor or an N-type semiconductor may be obtained through doping performed in the substrate, the substrate may have a large thickness, and different positions are used to be doped to form different doping structures in the IGBT. The substrate may have the first-type doping element, and the substrate correspondingly has a region corresponding to a subsequent IGBT buffer region 1003 and a region corresponding to a subsequent IGBT collector region 1004, but corresponding doping has not been performed.

The front-surface device region 1001 may be formed on the first surface of the substrate, and the front-surface device region 1001 may include a cell region 10 and a terminal region 20 surrounding the cell region 10. The terminal region 20 may implement a planar electric field voltage division function of the chip. The terminal region 20 may include a field plate region 21 and a field limiting ring region 22. The field plate region 21 surrounds the cell region 10, and the field limiting ring region 22 surrounds the field plate region 21.

When the IGBT is a planar gate IGBT, the cell region 10 may include a matrix region, a gate region 106, and a gate oxidized region 107. The matrix region includes a base region 103, a first emitting region 104, and a second emitting region 105. The first emitting region 104 and the second emitting region 105 are located on a side that is of the matrix region and that is away from the second surface A2. The first emitting region 104 has a first-type doping element, the second emitting region 105 has a second-type doping element, and the base region 103 has a second-type doping element. The first emitting region 104 is configured to connect to an emitter 108. A concentration of the second-type doping element in the second emitting region is greater than a concentration of the second-type doping element in the base region 103. The gate region 106 and the gate oxidized region 107 may be located on a side that is outside the matrix region and that is away from the second surface A2, and the gate oxidized region 107 is connected to both the first emitting region 104 and the base region 103. For example, the gate oxidized region 107 is located on a side that is of the first emitting region 104 and the base region 103 and that is away from the second surface A2, that is, located above the matrix region. The gate region 106 is located on a side that is of the gate oxidized region 107 and that is away from the second surface A2, that is, located above the gate oxidized region 107. The gate region 106 is configured to connect to a gate electrode and used as a control region of the device.

Forming the matrix region on the first surface of the substrate may be: performing doping of a second-type doping element on a part that is of the substrate and that is away from the second surface A2 to obtain the base region 103, performing doping of a first-type doping element on a first part that is of the base region 103 and that is away from the second surface A2 to obtain the first emitting region 104, and performing doping of a second-type doping element on a second part that is of the base region 103 and that is away from the second surface A2 to obtain the second emitting region 105. In this way, the concentration of the second-type doping element in the second emitting region 105 is greater than the concentration of the second-type doping element in a remaining part other than the first emitting region 104 and the second emitting region 105 in the base region 103.

Forming the gate region 106 and the gate oxidized region 107 on the first surface of the substrate may be: forming a gate oxide and a gate structure on a side that is outside the substrate and that is away from the second surface. A region in which the gate oxide is located is the gate oxidized region 107, and a region in which the gate structure is located is the gate region 106. The gate oxide and the gate structure may be formed by using a deposition process.

In an implementation, the gate oxidized region is formed before the gate region 106, and the base region may be formed before the gate oxidized region 107, or may be formed after the gate region 106.

When the IGBT is a trench gate IGBT, the cell region 10 may include a matrix region, and the matrix region includes a base region 103, a gate region 106, a gate oxidized region 107, a first emitting region 104, and a second emitting region 105. The gate region, the gate oxidized region, the first emitting region, and the second emitting region are located on a side that is of the matrix region and that is away from the second surface A2. The first emitting region 104 has a first-type doping element, the second emitting region 105 has a second-type doping element, and the base region 103 has a second-type doping element. The first emitting region 104 is configured to connect to an emitter 108. A concentration of the second-type doping element in the second emitting region is greater than a concentration of the second-type doping element in the base region 103. In addition, the gate region 106 and the gate oxidized region 107 may be located in the matrix region, the gate oxidized region 107 surrounds the gate region 106 in the matrix region, and the gate oxidized region 107 is connected to both the first emitting region 104 and the base region 103. For example, a side wall of the gate oxidized region 107 is connected to the first emitting region 104 on a side that is away from the second surface A2, and another part of the side wall is connected to the base region 103. The gate region 106 is configured to connect to a gate electrode and used as a control region of the device.

Forming the matrix region on the first surface of the substrate may be: performing doping of a second-type doping element on a part that is of the substrate and that is away from the second surface A2 to obtain the base region 103, performing doping of a first-type doping element on a first part that is of the base region 103 and that is away from the second surface A2 to obtain the first emitting region 104, and performing doping of a second-type doping element on a second part that is of the base region 103 and that is away from the second surface A2 to obtain the second emitting region 105, so that the concentration of the second-type doping element in the second emitting region 105 is greater than the concentration of the second-type doping element in a remaining part other than the first emitting region 104 and the second emitting region 105 in the base region 103.

Forming the gate region 106 and the gate oxidized region 107 on the first surface of the substrate may be: etching a third part that is of the substrate and that is away from the second surface to obtain a gate hole and forming a gate oxide and a gate structure in the gate hole. A region in which the gate oxide is located is the gate oxidized region 107, and a region in which the gate structure is located is the gate region 106.

In an implementation, the gate oxidized region is formed before the gate region 106, and the base region may be formed before the gate oxidized region 107, or may be formed after the gate region 106.

In this embodiment of this application, a cell dielectric layer may be used to cover the first emitting region 104 and the second emitting region 105. The cell dielectric layer may include a first dielectric layer 101 and a second dielectric layer 102 on the first dielectric layer 101. The first dielectric layer 101 covers the first emitting region 104 and the second emitting region 105. The first dielectric layer 101 may be an oxide isolation (LOCOS) layer, and a material of the second dielectric layer 102 may be silicon oxide. When the first emitting region 104 needs to be led out, the first dielectric layer 101 and the second dielectric layer 102 may be etched to obtain an etched hole, and a conductor material is formed in the etched hole. The conductor material may be used as the emitter 108.

The field plate region 21 may include a first field ring region 211, the first field ring region 211 may be connected to the emitter 108, the first field ring region 211 has a second-type doping element, and a field ring dielectric layer is disposed on the first field ring region 211. The field ring dielectric layer includes a third dielectric layer 212 and a fourth dielectric layer 213 on the third dielectric layer 212. The third dielectric layer 212 may be an oxide isolation layer, and a material of the fourth dielectric layer 213 may be silicon oxide. A gate bus 214 may be disposed on the fourth dielectric layer 213, and the gate bus 214 may be connected to the gate electrode of the cell region 10. The field limiting ring region 22 may include a plurality of second field ring regions 221, and a field limiting ring dielectric layer is disposed on the second field ring region 221. The field limiting ring dielectric layer may include a fifth dielectric layer 222 and a sixth dielectric layer 223 on the fifth dielectric layer 222. The fifth dielectric layer 222 may be an oxide isolation layer, and a material of the sixth dielectric layer 223 may be silicon oxide. A control structure 225 and a lead-out structure 224 on the control structure are further disposed on the fifth dielectric layer 222. The lead-out structure 224 may penetrate the sixth dielectric layer 223. A material of the control structure 225 may be polysilicon, and a material of the lead-out structure 224 may be aluminum.

The first-type doping element and the second-type doping element are doping elements of different types, which are the P type and the N type respectively. A semiconductor doped with the first-type doping element has a first conductivity type, a semiconductor doped with the second-type doping element has a second conductivity type, and the first conductivity type and the second conductivity type are different conductivity types. A conductivity type of a semiconductor doped with the P-type doping element is the P type, and a conductivity type of a semiconductor doped with the N-type doping element is the N type. As an example, the first conductivity type may be the N type, and the second conductivity type may be the P type. In this case, a conductivity type of the base region 103 is P, a conductivity type of the first emitting region 104 is N, a conductivity type of the second emitting region 105 is P, and conductivity types of the first field ring region 211 and the second field ring region 221 each are the P type. The base region 103, the first emitting region 104, the second emitting region 105, the first field ring region 211, the second field ring region 221 may be different positions of the substrate, and are obtained through doping in different positions. The doping of the base region 103 may be light doping and is indicated by P−, and the doping of the first emitting region 104 and the second emitting region 105 may be heavy doping and are respectively indicated by N+ and P+.

After the front-surface device region 1001 is formed, the substrate may be thinned from the second surface. After the thinning, the thickness of the substrate is reduced, which is usually 80 to 120 micrometers (μm). Certainly, the thickness of the substrate after the thinning is related to a thickness of the doped structure, and therefore is related to a BV withstand voltage of the device. A person skilled in the art may set the thickness of the device based on an actual situation.

Figure 11:
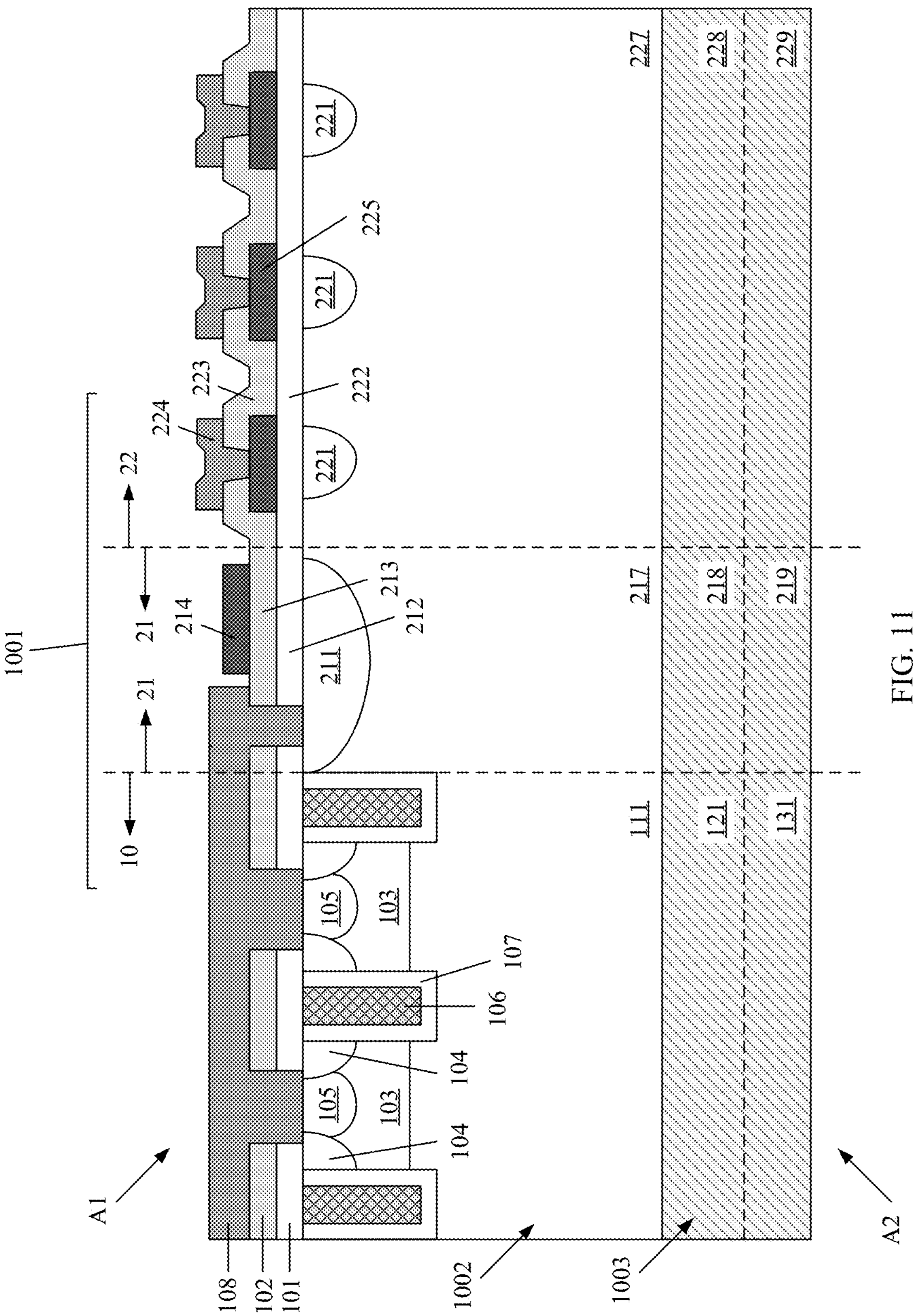

S102: Perform doping the first-type doping element on a part that is of the substrate and that faces the second surface, to obtain an IGBT buffer region 1003, where a substrate between the front-surface device region 1001 and the IGBT buffer region 1003 is used as an IGBT drift region 1002, as shown in FIG. 11.

After the front-surface device region 1001 is formed, the doping of the first-type doping element may be performed on the substrate from the second surface of the substrate to obtain the IGBT buffer region 1003, and the substrate between the front-surface device region 1001 and the IGBT buffer region 1003 is used as the IGBT drift region 1002.

The IGBT drift region 1002 is located on a side that is of the front-surface device region 1001 and that faces the second surface, that is, the IGBT drift region 1002 is located below the front-surface device region 1001, and the IGBT drift region 1002 is connected to the front-surface device region 1001. For example, the IGBT drift region 1002 is connected to the base region 103 of the cell region 10, to the first field ring region 211 of the field plate region 21, and to the second field ring region 221 of the field limiting ring region 22. The IGBT drift region 1002 may further be connected to the gate oxidized region of the cell region 10. The IGBT drift region 1002 may have a first-type doping element. A part of the IGBT drift region 1002 located on a side that is of the cell region 10 and that faces the second surface A2 may be denoted as a first drift region 111, a part of the IGBT drift region 1002 located on a side that is of the field plate region 21 and that faces the second surface A2 may be denoted as a second drift region 217, and a part of the IGBT drift region 1002 located on a side that is of the field limiting ring region 22 and that faces the second surface A2 may be denoted as a third drift region 227.

In other words, the first drift region 111 is located below the cell region 10, and the first drift region 111 coincides with a projection of the cell region 10 on the first surface A1. The second drift region 217 is located below the field plate region 21, and the second drift region 217 coincides with a projection of the field plate region 21 on the first surface A1. The third drift region 227 is located below the field limiting ring region 22, and the third drift region 227 coincides with a projection of the field limiting ring region 22 on the first surface A1. The first drift region 111, the second drift region 217, and the third drift region 227 have a same doping concentration, and the IGBT buffer region 1003 is formed by using a same doping process, and may have a same doping depth in different positions. Therefore, the first drift region 111, the second drift region 217, and the third drift region 227 have a same material and size.

The IGBT buffer region 1003 is located on a side that is of the IGBT drift region 1002 and that faces the second surface A2, that is, the IGBT buffer region 1003 is located below the IGBT drift region 1002, and the IGBT buffer region 1003 is connected to the IGBT drift region 1002. The IGBT buffer region 1003 has a first-type doping element, that is, the doping element is of a same type as the doping element of the IGBT drift region 1002. In addition, a concentration of the first-type doping element in the IGBT buffer region 1003 is greater than a concentration of the first-type doping element in the IGBT drift region 1002, and the IGBT buffer region 1003 may be used as a field stop layer to improve performance of the IGBT. A part of the IGBT buffer region 1003 located on a side that is of the first drift region 111 and that faces the second surface A2 is denoted as a first buffer region 121, a part of the IGBT buffer region 1003 located on a side that is of the second drift region 217 and that faces the second surface A2 is denoted as a second buffer region 218, and a part of the IGBT buffer region 1003 located on a side that is of the third drift region 227 and that faces the second surface A2 is denoted as a third buffer region 228.

In other words, the first buffer region 121 is located below the first drift region 111, and the first buffer region 121 coincides with the projection of the cell region 10 on the first surface A1. The second buffer region 218 is located below the second drift region 217, and the second buffer region 218 coincides with the projection of the field plate region 21 on the first surface A1. The third buffer region 228 is located below the third drift region 227, and the third buffer region 228 coincides with the projection of the field limiting ring region 22 on the first surface A1. The first buffer region 121, the second buffer region 218, and the third buffer region 228 have a same doping concentration, are formed by using a same doping process, and may have a same doping depth. Therefore, the first buffer region 121, the second buffer region 218, and the third buffer region 228 have a same material and size.

Figure 12:
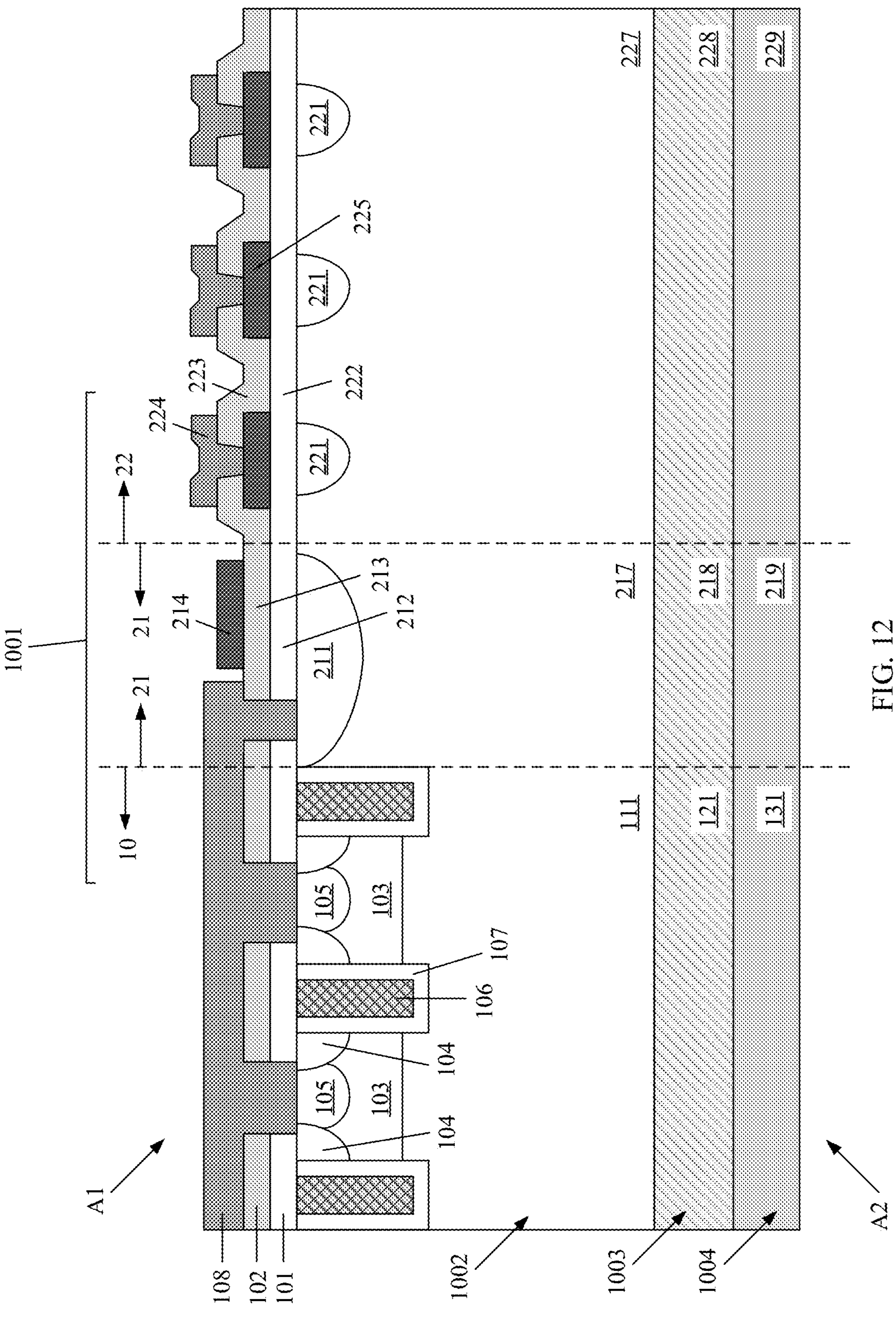

S103: Perform first doping of a second-type doping element on a part that is of the IGBT drift region 1002 and that faces the second surface, to obtain an IGBT collector region 1004, as shown in FIG. 12.

The IGBT collector region 1004 may be obtained by performing the first doping of the second-type doping element on the part that is of the IGBT drift region 1002 and that faces the second surface. The first surface A1 and the second surface A2 are opposite surfaces, for example, when the first surface A1 is an upper surface, the second surface A2 may be a lower surface. The IGBT collector region 1004 is located on a side that is of the IGBT buffer region 1003 and that faces the second surface A2, that is, the IGBT collector region 1004 is located below the IGBT buffer region 1003. The IGBT collector region 1004 is connected to the IGBT buffer region 1003 and is configured to connect to a collector. The IGBT collector region 1004 may have a second-type doping element, that is, the doping element is of an opposite type to the doping element of the IGBT buffer region 1003. A part of the IGBT collector region 1004 located on a side that is of the first buffer region 121 and that faces the second surface A2 may be denoted as a cell collector region 131, a part of the IGBT collector region 1004 located on a side that is of the terminal region 20 and that faces the second surface A2 may be denoted as a terminal collector region, in the terminal collector region, a part of the IGBT collector region 1004 located on a side that is of the second buffer region 218 and that faces the second surface A2 may be denoted as a field plate collector region 219, and a part of the IGBT collector region 1004 located on a side that is of the third buffer region 228 and that faces the second surface A2 may be denoted as a field limiting ring collector region 229.

In other words, the cell collector region 131 is located below the first buffer region 121, and the cell collector region 131 coincides with the projection of the cell region 10 on the first surface A1. The terminal collector region is located below the second buffer region 218 and the third buffer region 228, and the terminal collector region coincides with a projection of the terminal region 20 on the first surface A1. The field plate collector region 219 in the terminal collector region is located below the second buffer region 218, and the field plate collector region 219 coincides with the projection of the field plate region 21 on the first surface A1. The field limiting ring collector region 229 is located below the third buffer region 228, and the field limiting ring collector region 229 coincides with the projection of the field limiting ring region 22 on the first surface A1. After the first doping, the cell collector region 131, the field plate collector region 219, and the field limiting ring collector region 229 have a same doping concentration, are formed by using a same doping process, and may have a same doping depth. Therefore, the cell collector region 131, the field plate collector region 219, and the field limiting ring collector region 229 have a same material and size.

As an example, the first conductivity type may be the N type, and the second conductivity type may be the P type. In this case, the conductivity type of the base region 103 is P, the conductivity type of the first emitting region 104 is N, the conductivity type of the second emitting region 105 is P, the conductivity types of the first field ring region 211 and the second field ring region 221 each are the P type, a conductivity type of the IGBT drift region 1002 is N, a conductivity type of the IGBT buffer region 1003 is N, and a conductivity type of the IGBT collector region 1004 is P. The base region 103, the first emitting region 104, the second emitting region 105, the first field ring region 211, the second field ring region 221, the IGBT drift region 1002, the IGBT buffer region 1003, and the IGBT collector region 1004 may be different positions on the substrate and obtained through doping in different positions. The doping of the base region 103 may be the light doping and is indicated by P−, the doping of the first emitting region 104 and the second emitting region 105 may be the heavy doping and are respectively indicated by N+ and P+, the doping of the IGBT drift region 1002 may be the light doping and is indicated by N−, and the doping of the IGBT buffer region 1003 may be the heavy doping and is indicated by N+. A doping concentration range may be 1E12 to 1E13.

S104: Shield the field plate collector region 219, and perform second doping of the second-type doping element on the IGBT collector region 1004. Refer to FIG. 7, FIG. 8, FIG. 13 and FIG. 14.

In this embodiment of this application, after the first doping of the second-type doping element on the IGBT collector region 1004 is performed, the field plate collector region 219 may be shielded, to perform the second doping of the second-type doping element on the IGBT collector region 1004, so that a concentration of a second-type doping element in the cell collector region 131 is larger than a concentration of a second-type doping element in the field plate collector region 219. Based on the functional relationship between the amplification factor of the PNP transistor and the emitting region and the base region, it can be learned that reducing the injection dosage of the P collector under the field plate region 21 can reduce the amplification factor of the triode in the field plate region 21 in a targeted manner. In other words, in this embodiment of this application, holes of different concentrations are injected into the cell collector region 131 and the field plate collector region 219, and local leakage current control is performed, to reduce an amplification factor. Therefore, a voltage withstand capability of the device can be improved, a BV negative resistance phenomenon can be eliminated, and reliability of the device can be improved without affecting a level of a saturation voltage drop of the device.

The terminal collector region may have a uniform concentration of the second-type doping element. In other words, the concentration of the second-type doping element in the field plate collector region 219 is equal to a concentration of a second-type doping element in the field limiting ring collector region 229, and the concentration of the second-type doping element in the cell collector region 131 is greater than the concentration of the second-type doping element in the field plate collector region 219, and is greater than the concentration of the second-type doping element in the field limiting ring collector region 229 at the same time, as shown in FIG. 7. In this case, when the field plate collector region 219 is shielded, the field limiting ring collector region 229 may be shielded, that is, the field plate collector region is shielded, and the second doping of the second-type doping element is performed on the IGBT collector region, so that the concentration of the second-type doping element in the cell collector region 131 is greater than the concentration of the second-type doping element in the field plate collector region 219. This may be that the field plate collector region 219 and the field limiting ring collector region 229 are shielded, the second doping of the second-type doping element is performed on the IGBT collector region 1004, so that the concentration of the second-type doping element in the cell collector region 131 is greater than the concentration of the second-type doping element in the field plate collector region 219, and is greater than the concentration of the second-type doping element in the field limiting ring collector region 229. Certainly, the concentration of the second-type doping element in the field plate collector region 219 is equal to the concentration of the second-type doping element in the field limiting ring collector region 229.

The terminal collector region may have a non-uniform concentration of the second-type doping element. For example, the concentration of the second-type doping element in the field plate collector region 219 is less than the concentration of the second-type doping element in the field limiting ring collector region 229, but the concentration of the second-type doping element in the cell collector region 131 is greater than the concentration of the second-type doping element in the field plate collector region 219, and may be equal to the concentration of the second-type doping element in the field limiting ring collector region 229 at the same time, as shown in FIG. 8. In this case, after the field plate collector region 219 is shielded, and the second doping is performed on the IGBT collector region 1004, the concentration of the second-type doping element in the cell collector region 131 is greater than the concentration of the second-type doping element in the field plate region, and the concentration of the second-type doping element in the field limiting ring collector region 229 is greater than the concentration of the second-type doping element in the field plate collector region 219. This is because a region under the field plate region 21 is a region in which an electric field strength is most concentrated, and leakage current control for the region can effectively control an overall leakage current of the device.

During an implementation, a doping concentration of the second doping is greater than a doping concentration of the first doping. The first doping may be the light doping, and the second doping may be the heavy doping. The field plate collector region 219 may be shielded by a photomask, and a same photomask may be used to shield the field limiting ring collector region 229 while shielding the field plate collector region 219.

Figure 13:
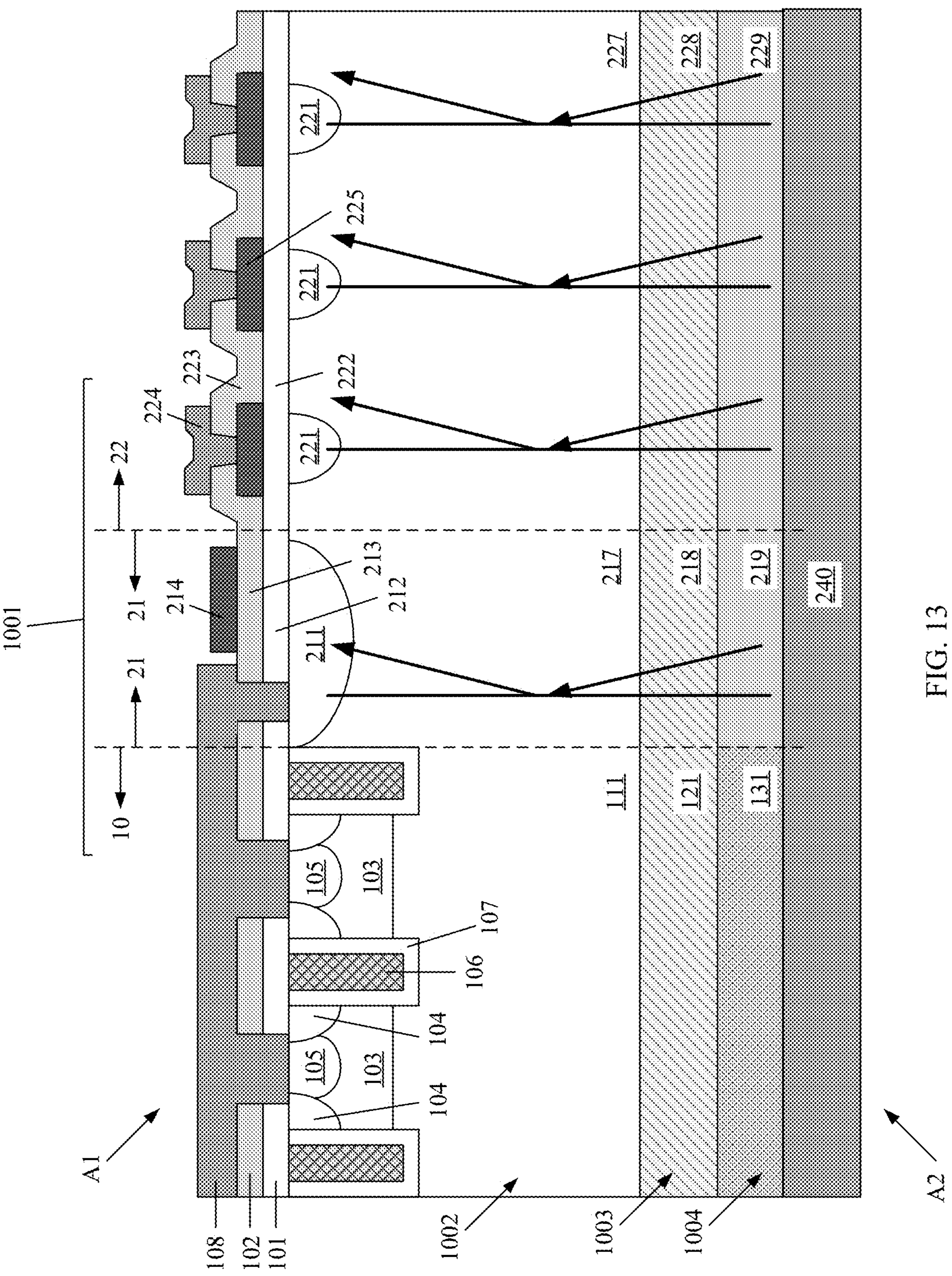
Figure 14:
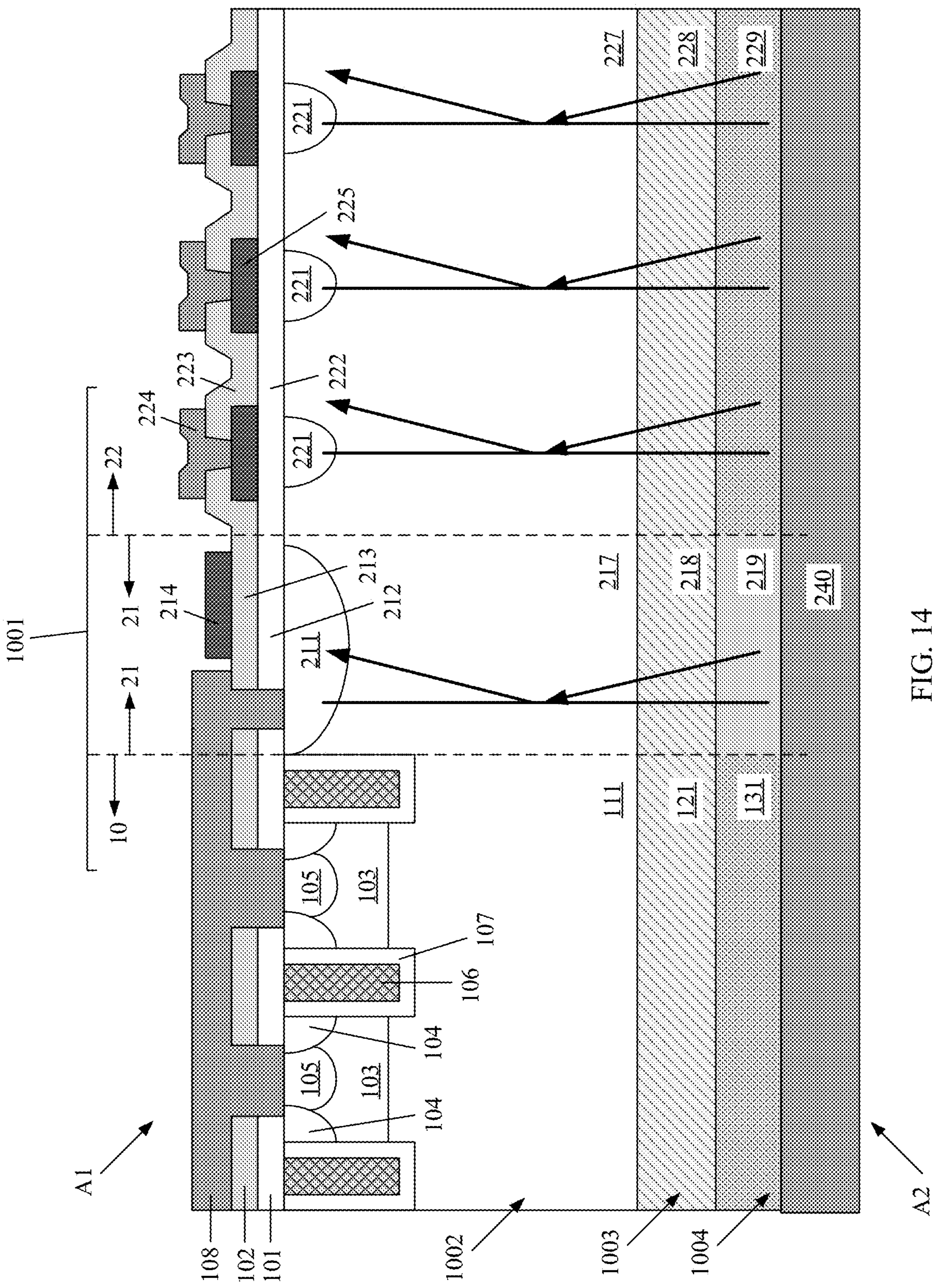

After the second doping is performed on the IGBT collector region 1004, a collector 240 may be formed on the second surface, and a material of the collector 240 may be a material with good electrical conductivity, for example, a metal material. The collector 240 is connected to the IGBT collector region 1004, as shown in FIG. 13 and FIG. 14.

An embodiment of this application provides an insulated gate bipolar transistor IGBT manufacturing method. A front-surface device region is formed on a first surface of a substrate, and the front-surface device region may include a cell region and a terminal region surrounding the cell region, and the terminal region includes a field plate region surrounding the cell region and a field limiting ring region surrounding the field plate region. The substrate has a first-type doping element, and doping of the first-type doping element is performed on a part that is of the substrate and that faces a second surface, to obtain an IGBT buffer region. A substrate between the front-surface device region and the IGBT buffer region is used as an IGBT drift region. A concentration of a first-type doping element in the IGBT buffer region is greater than a concentration of a first-type doping element in the IGBT drift region. First doping of a second-type doping element is performed on a part that is of the IGBT drift region and that faces the second surface, to obtain an IGBT collector region. The IGBT collector region includes a cell collector region, a field plate collector region, and a field limiting ring collector region. The field plate collector region is shielded, and second doping of the second-type doping element is performed on the IGBT collector region. When a concentration of a second-type doping element in the cell collector region is greater than a concentration of a second-type doping element in the field plate collector region, the field plate region is more prone to breakdown than the cell region. In this way, the concentration of the second-type doping element in the cell collector region can be designed to be greater than the concentration of the second-type doping element in the field plate collector region. In other words, a part of the collector region opposite to the cell region has a second-type doping element with a larger concentration, and a part of the collector region opposite to the field plate region has a second-type doping element with a smaller concentration. This effectively reduces an amplification factor of a parasitic triode in the field plate region, reduces a leakage current value of the device when the device withstands a reverse withstand voltage, improves a withstand voltage characteristic and a safe operation area characteristic of the device, enhances robustness of the device, and improves overall operating performance of the device.

An embodiment of this application further provides an electronic device, including a circuit board and the IGBT connected to the circuit board. The electronic device may be a power converter, and the power converter includes an inverter, a rectifier, and the like.

Embodiments in this specification are all described in a progressive manner, for same or similar parts in embodiments, refer to these embodiments, and each embodiment focuses on a difference from other embodiments.

The foregoing provides implementations of this application. It should be understood that the foregoing embodiments are merely intended for describing the technical solutions of this application, but not for limiting this application. Although this application is described in detail with reference to the foregoing embodiments, a person of ordinary skill in the art should understand that modifications can still be made to the technical solutions described in the foregoing embodiments or equivalent replacements can be made to some technical features thereof, without departing from the scope of the technical solutions of embodiments of this application.

What is claimed is:

1. An insulated gate bipolar transistor (IGBT), comprising:

a first surface and a second surface that are opposite to each other, and in a direction from the first surface to the second surface, a front-surface device region, an IGBT drift region, an IGBT buffer region, and an IGBT collector region are sequentially connected;

the front-surface device region comprising a cell region and a terminal region surrounding the cell region, the terminal region comprising a field plate region surrounding the cell region and a field limiting ring region surrounding the field plate region;

the IGBT drift region has a first-type doping element;

the IGBT buffer region has a first-type doping element and a concentration of the first-type doping element in the IGBT buffer region is greater than the concentration of the first-type doping element in the IGBT drift region;

the IGBT collector region comprises a cell collector region, a field plate collector region, and a field limiting ring collector region, the IGBT collector region has a second-type doping element, the cell collector region coincides with a projection of the cell region on the first surface, the field plate collector region coincides with a projection of the field plate region on the first surface, the field limiting ring collector region coincides with a projection of the field limiting ring region on the first surface, and a concentration of the second-type doping element in the cell collector region is greater than the concentration of a second-type doping element in the field plate collector region; and the first type is a P type or an N type, the second type is a P type or an N type, and the first type and the second type are different.

2. The IGBT according to claim 1, wherein the cell collector region is a heavily doped region, and the field plate collector region is a lightly doped region.

3. The IGBT according to claim 1, wherein the concentration of the second-type doping element in the cell collector region is greater than the concentration of a second-type doping element in the field limiting ring collector region.

4. The IGBT according to claim 1, wherein the cell collector region is a heavily doped region, and the field limiting ring collector region is a lightly doped region.

5. The IGBT according to claim 1, wherein the IGBT is a planar gate IGBT; and the cell region comprises a matrix region, a gate region, and a gate oxidized region, the matrix region comprises a base region, a first emitting region, and a second emitting region, the first emitting region and the second emitting region are located on a side that is of the matrix region that is away from the second surface, the first emitting region has a first-type doping element, the second emitting region has a second-type doping element, the base region has the second-type doping element, the first emitting region is configured to connect to an emitter, the concentration of the second-type doping element in the second emitting region is greater than the concentration of the second-type doping element in the base region, the gate region is configured to connect to a gate electrode, the gate region and the gate oxidized region are located on a side that is outside the matrix region and that is away from the second surface, and the IGBT collector region is configured to connect to a collector.

6. The IGBT according to claim 1, wherein the IGBT is a trench gate IGBT; and the cell region comprises a matrix region, the matrix region comprises a base region, a gate region, a gate oxidized region, a first emitting region, and a second emitting region, the gate region, the gate oxidized region, the first emitting region, and the second emitting region are located on a side that is of the matrix region that is away from the second surface, the first emitting region has a first-type doping element, the second emitting region has a second-type doping element, the base region has the second-type doping element, the first emitting region is configured to connect to an emitter, a concentration of the second-type doping element in the second emitting region is greater than the concentration of the second-type doping element in the base region, the gate region is configured to connect to a gate electrode, the gate oxidized region surrounds the gate region in the matrix region, and the IGBT collector region is configured to connect to a collector.

7. The IGBT according to claim 1, wherein the field plate region comprises a first field ring region, a gate bus, and a field plate dielectric layer located between the first field ring region and the gate bus, the first field ring region has the second-type doping element for connecting to the emitter, and the gate bus is configured to connect to the gate electrode; and the field limiting ring region comprises a second field ring region, a control structure, and a field limiting ring dielectric layer located between the second field ring region and the control structure, and the second field ring region has the second-type doping element.

8. The IGBT according to claim 1, wherein the first type is the N type, and the second type is the P type.

9. An insulated gate bipolar transistor (IGBT) manufacturing method, wherein the method comprises:

forming a front-surface device region on a first surface of a substrate, the substrate having a first-type doping element, the front-surface device region comprising a cell region and a terminal region surrounding the cell region, and the terminal region comprising a field plate region surrounding the cell region and a field limiting ring region surrounding the field plate region;

performing doping of the first-type doping element on a part that is of the substrate and that faces a second surface to obtain an IGBT buffer region, a concentration of a first-type doping element in the IGBT buffer region being greater than a concentration of the first-type doping element in the substrate, the substrate between the front-surface device region and the IGBT buffer region is used as an IGBT drift region, and the first surface and the second surface are opposite surfaces;

performing first doping of a second-type doping element on a part that is of the IGBT drift region that faces the second surface to obtain an IGBT collector region, the IGBT collector region comprising a cell collector region, a field plate collector region, and a field limiting ring collector region, the cell collector region coincides with a projection of the cell region on the first surface, the field plate collector region coincides with a projection of the field plate region on the first surface, the field limiting ring collector region coincides with the projection of the field limiting ring region on the first surface, the first type is a P type or an N type, the second type is a P type or an N type, and the first type and the second type are different; and shielding the field plate collector region and performing second doping of the second-type doping element on the IGBT collector region so that a concentration of a second-type doping element in the cell collector region is greater than a concentration of a second-type doping element in the field plate collector region.

10. The method according to claim 9, wherein the shielding the field plate collector region and performing the second doping of the second-type doping element on the IGBT collector region, so that the concentration of the second-type doping element in the cell collector region is greater than the concentration of the second-type doping element in the field plate collector region comprises:

shielding the field plate collector region and the field limiting ring collector region, and performing the second doping of the second-type doping element on the IGBT collector region so that the concentration of the second-type doping element in the cell collector region is greater than the concentration of the second-type doping element in the field plate collector region and is greater than the concentration of the second-type doping element in the field limiting ring collector region.

11. The method according to claim 9, wherein the first doping is light doping, and the second doping is heavy doping.

12. The method according to claim 9, wherein if the IGBT is a planar gate IGBT, the cell region comprises a matrix region, a gate region, and a gate oxidized region, the matrix region comprises a base region, a first emitting region, and a second emitting region, the first emitting region and the second emitting region are located on a side that is of the matrix region that is away from the second surface, the first emitting region is configured to connect to an emitter, the gate region is configured to connect to a gate electrode, the IGBT collector region is configured to connect to a collector, and the gate region and the gate oxidized region are located on a side that is outside the substrate and that is away from the second surface; and forming the matrix region on the first surface of the substrate comprises: performing doping of the second-type doping element on the part that is of the substrate that is away from the second surface to obtain the base region, performing doping of a first-type doping element on the first part that is of the base region that is away from the second surface to obtain the first emitting region, and performing doping of the second-type doping element on a second part that is of the base region that is away from the second surface to obtain the second emitting region.

13. The method according to claim 9, wherein if the IGBT is a trench gate IGBT, the cell region comprises a matrix region, the matrix region comprises a base region, a gate region, a gate oxidized region, a first emitting region, and a second emitting region, the gate region, the gate oxidized region, the first emitting region, and the second emitting region are located on a side that is of the matrix region that is away from the second surface, the first emitting region is configured to connect to an emitter, the gate region is configured to connect to a gate electrode, the IGBT collector region is configured to connect to a collector, and the gate region and the gate oxidized region are located on a side that is of the substrate that is away from the second surface; and forming the matrix region on the first surface of the substrate comprises: performing doping of the second-type doping element on a part that is of the substrate and that is away from the second surface to obtain the base region, performing doping of the first-type doping element on a first part that is of the base region and that is away from the second surface to obtain the first emitting region, and performing doping of a second-type doping element on a second part that is of the base region and that is away from the second surface to obtain the second emitting region.

14. The method according to claim 9, wherein the field plate region comprises a first field ring region, a gate bus, and a field plate dielectric layer located between the first field ring region and the gate bus, the first field ring region has the second-type doping element for connecting to the emitter, and the gate bus is configured to connect to the gate electrode; and the field limiting ring region comprises a second field ring region, a control region, and a field limiting ring dielectric layer located between the second field ring region and the control region, and the second field ring region has the second-type doping element.

15. The method according to claim 9, wherein the first type is the N type, and the second type is the P type.

16. An electronic device, comprising:

a circuit board; and an insulated gate bipolar transistor (IGBT) connected to the circuit board, the IGBT comprising:

a first surface and a second surface that are opposite to each other, and in a direction from the first surface to the second surface, a front-surface device region, an IGBT drift region, an IGBT buffer region, and an IGBT collector region are sequentially connected;

the front-surface device region comprising a cell region and a terminal region surrounding the cell region, the terminal region comprising a field plate region surrounding the cell region and a field limiting ring region surrounding the field plate region;

the IGBT drift region has a first-type doping element;

the IGBT buffer region has a first-type doping element and a concentration of the first-type doping element in the IGBT buffer region is greater than the concentration of the first-type doping element in the IGBT drift region;

the IGBT collector region comprises a cell collector region, a field plate collector region, and a field limiting ring collector region, the IGBT collector region has a second-type doping element, the cell collector region coincides with a projection of the cell region on the first surface, the field plate collector region coincides with a projection of the field plate region on the first surface, the field limiting ring collector region coincides with a projection of the field limiting ring region on the first surface, and a concentration of the second-type doping element in the cell collector region is greater than the concentration of a second-type doping element in the field plate collector region; and the first type is a P type or an N type, the second type is a P type or an N type, and the first type and the second type are different.

17. The electronic device according to claim 16, wherein the electronic device is a power converter.

* * * * *